(12) United States Patent
Lim et al.

(10) Patent No.: US 7,675,148 B2
(45) Date of Patent: Mar. 9, 2010

(54) POWER MODULE HAVING STACKED FLIP-CHIP AND METHOD OF FABRICATING THE POWER MODULE

(75) Inventors: Seung-won Lim, Bucheon-si (KR); O-Seob Jeon, Seoul (KR); Joon-seo Son, Seoul (KR); Keun-hyuk Lee, Bucheon-si (KR); Yun-hwa Choi, Incheon (KR)

(73) Assignee: Fairchild Korea Semiconductor Ltd., Bucheon-si, Gyeonggi-do (KR)

( * ) Notice: Subject to any disclaimer, the term of this patent is extended or adjusted under 35 U.S.C. 154(b) by 0 days.

(21) Appl. No.: 12/074,225

(22) Filed: Feb. 28, 2008

(65) Prior Publication Data

US 2008/0224285 A1    Sep. 18, 2008

(30) Foreign Application Priority Data

Mar. 12, 2007    (KR) .................... 10-2007-0024212

(51) Int. Cl.
*H01L 23/495* (2006.01)
(52) U.S. Cl. .............................. 257/676; 257/E23.047; 257/E23.045; 257/E23.043; 257/E23.052; 257/E23.031
(58) Field of Classification Search .......... 257/E23.047, 257/E23.048, E23.045, E23.043, E23.06, 257/E23.052, E23.031, E23.062, 676
See application file for complete search history.

(56) References Cited

U.S. PATENT DOCUMENTS

| | | | |
|---|---|---|---|
| 5,297,006 A | | 3/1994 | Mizukoshi |
| 5,471,369 A | * | 11/1995 | Honda et al. ................. 361/813 |
| 5,703,399 A | | 12/1997 | Majumdar et al. |
| 6,002,166 A | | 12/1999 | Noda et al. |
| 6,281,578 B1 | * | 8/2001 | Lo et al. ...................... 257/724 |
| 6,336,269 B1 | * | 1/2002 | Eldridge et al. ............... 29/885 |
| 6,421,244 B1 | | 7/2002 | Shinohara et al. |

(Continued)

FOREIGN PATENT DOCUMENTS

KR    2002-0095053 A1    12/2002

*Primary Examiner*—N Drew Richards
*Assistant Examiner*—Yu-Hsi Sun
(74) *Attorney, Agent, or Firm*—Townsend and Townsend and Crew LLP

(57) ABSTRACT

Provided are a power module having a stacked flip-chip and a method of fabricating the power module. The power module includes a lead frame; a control device part including a control device chip; a power device part including a power device chip and being electrically connected to the lead frame; and an interconnecting substrate of which the control and power device parts are respectively disposed at upper and lower portions, and each of the control and power device chips may be attached to one of the lead frame and the interconnecting substrate using a flip-chip bonding method. The method includes forming bumps on power and control device chips on a wafer level; separately sawing the power and control device chips into individual chips; adhering the power device chip onto a thermal substrate and the control device chip onto an interconnecting substrate; combining a lead frame, the thermal substrate, and the interconnecting substrate with one another in a multi-jig; and sealing the power and control device chips, and the control and power device chips may be attached to one of the lead frame and the interconnecting substrate using a flip-chip bonding method.

21 Claims, 27 Drawing Sheets

U.S. PATENT DOCUMENTS

| | | | |
|---|---|---|---|
| 6,442,033 B1 * | 8/2002 | Liu et al. ..................... 361/743 |
| 6,489,678 B1 | 12/2002 | Joshi |
| 6,509,629 B2 | 1/2003 | Yoshimatsu et al. |
| 6,556,750 B2 | 4/2003 | Constantino et al. |
| 6,566,749 B1 | 5/2003 | Joshi et al. |
| 6,574,107 B2 | 6/2003 | Jeon et al. |
| 6,621,152 B2 | 9/2003 | Choi et al. |
| 6,627,991 B1 | 9/2003 | Joshi |
| 6,642,738 B2 | 11/2003 | Elbanhawy |
| 6,645,791 B2 | 11/2003 | Noquil et al. |
| 6,674,157 B2 | 1/2004 | Lang |
| 6,683,375 B2 | 1/2004 | Joshi et al. |
| 6,690,089 B2 * | 2/2004 | Uchida ....................... 257/686 |
| 6,696,321 B2 | 2/2004 | Joshi |
| 6,720,642 B1 | 4/2004 | Joshi et al. |
| 6,731,003 B2 | 5/2004 | Joshi et al. |
| 6,740,541 B2 | 5/2004 | Rajeev |
| 6,756,689 B2 | 6/2004 | Nam et al. |
| 6,774,465 B2 | 8/2004 | Lee et al. |
| 6,777,800 B2 | 8/2004 | Madrid et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,867,481 B2 | 3/2005 | Joshi et al. |
| 6,867,489 B1 | 3/2005 | Estacio |
| 6,891,256 B2 | 5/2005 | Joshi et al. |
| 6,891,257 B2 | 5/2005 | Chong et al. |
| 6,893,901 B2 | 5/2005 | Madrid |
| 6,943,434 B2 | 9/2005 | Tangpuz et al. |
| 6,989,588 B2 | 1/2006 | Quinones et al. |
| 6,992,384 B2 | 1/2006 | Joshi |
| 7,022,548 B2 | 4/2006 | Joshi et al. |
| 7,023,077 B2 | 4/2006 | Madrid |
| 7,045,907 B2 | 5/2006 | Shinohara |
| 7,061,077 B2 | 6/2006 | Joshi |
| 7,061,080 B2 | 6/2006 | Jeun et al. |
| 7,081,666 B2 | 7/2006 | Joshi et al. |
| 7,122,884 B2 | 10/2006 | Cabahug et al. |
| 7,154,168 B2 | 12/2006 | Joshi et al. |
| 7,157,799 B2 | 1/2007 | Noquil et al. |
| 7,164,197 B2 * | 1/2007 | Mao et al. ..................... 257/700 |
| 7,196,313 B2 | 3/2007 | Quinones et al. |
| 7,199,461 B2 | 4/2007 | Son et al. |
| 7,208,819 B2 | 4/2007 | Jeun et al. |
| 7,215,011 B2 | 5/2007 | Joshi et al. |
| 7,217,594 B2 | 5/2007 | Manatad |
| 7,242,076 B2 | 7/2007 | Dolan |
| 7,256,479 B2 | 8/2007 | Noquil et al. |
| 7,268,414 B2 | 9/2007 | Choi et al. |
| 7,271,497 B2 | 9/2007 | Joshi et al. |
| 7,285,849 B2 | 10/2007 | Cruz et al. |
| 7,315,077 B2 | 1/2008 | Choi et al. |
| 7,332,806 B2 | 2/2008 | Joshi et al. |
| 7,371,616 B2 | 5/2008 | Jereza |
| 7,439,613 B2 | 10/2008 | Joshi et al. |
| 2002/0100986 A1 * | 8/2002 | Soga et al. ..................... 257/779 |
| 2002/0185735 A1 * | 12/2002 | Sakurai et al. ............... 257/737 |
| 2005/0056918 A1 * | 3/2005 | Jeun et al. ..................... 257/678 |

* cited by examiner

POWER MODULE HAVING STACKED FLIP-CHIP AND METHOD OF FABRICATING THE POWER MODULE

CROSS-REFERENCES TO RELATED APPLICATIONS

This application claims the benefit of Korean Patent Application No. 10-2007-0024212, filed on Mar. 12, 2007, in the Korean Intellectual Property Office, the disclosure of which is incorporated herein in its entirety by reference.

BACKGROUND OF THE INVENTION

1. Field of the Invention

Embodiments of the present invention relate to a semiconductor package and a method of fabricating the same, and more particularly, to a stack type power module and a method of fabricating the same.

2. Description of the Related Art

In general, when a semiconductor package is fabricated, a semiconductor chip or a plurality of semiconductor chips is mounted on a lead frame or a printed circuit board (PCB), and sealed for protection reasons using a sealant, e.g., an epoxy molding compound (EMC). The semiconductor package is mounted on a mother board or a system PCB.

In line with requirements for high speed, large storage capacity, and high integration of electronic devices, demands for compact, light, and inexpensive power devices have increased. To satisfy such demands, a plurality of semiconductor chips is mounted in a semiconductor package to constitute a stack type power module. However, in such a stack type power module, chips are generally connected to a lead frame or the like using wire bonding. Thus, the possibilities to reduce the size of the stack type power module are limited.

FIG. 1 is a cross-sectional view of a conventional power module package disclosed in Korean Patent Publication Gazette No. 2002-0095053, entitled "Power Module Package Having Improved Heat Emission Capability and Method of Fabricating the Same." Referring to FIG. 1, the conventional power module package has a structure in which a plurality of power device chips 22 and a plurality of control device chips 30 are mounted on a lead frame 40 and sealed using a sealant 50. The lead frame 40 is divided into portions A and B, which are different from each other and in which the power device chips 22 and the control device chips 30 are respectively mounted. In other words, a thermal substrate 10 is disposed under the portion A of the lead frame 40 to emit heat generated from the power device chips 22. The thermal substrate 10 is attached to the portion A of the lead frame 40 through a solder paste 12.

In the conventional power module package, the power device chips 22 or the control device chips 30 are mounted on the lead frame 40 through metal wires 24 formed of Au or Al using a bonding method. Thus, a space for wire bonding must be secured. Thus, the possibility to reduce the size of the conventional power module package is limited. Also, since wire bonding is used, the wires may be cut or an operation characteristic of the conventional power module package may be deteriorated due to a long length of the wires.

FIG. 2 is a cross sectional view of another conventional power module package disclosed in U.S. Pat. No. 5,703,399, entitled "Semiconductor Power Module." Referring to FIG. 2, the conventional power module package has a structure in which a plurality of power device chips 5a and a plurality of control device chips 4a are mounted on a lead frame 3, and a thermal substrate 1 is disposed under the lead frame 3. A sealant for sealing the power device chips 5a and the control device chips 4a is divided into upper and lower sealants 7 and 2. The lower sealant 2 is formed of a highly thermal conductive material. A resistive component Sb is disposed on the left side of the power device chips 5a, and the conventional power module package is divided into portions A and B in which the power device chips 5a and the control device chips 4a are respectively mounted. Here, 6A and 6B are metal wires.

In the conventional power module package of FIG. 2, the power device chips 5a and the control device chips 4a are mounted on the lead frame 3 using wire bonding as described above. Thus, like in the case of the conventional power module package of FIG. 1, the possibility to reduce the size of the conventional power module package of FIG. 2 is limited. Also, since the upper and lower sealants 7 and 2 are formed of different materials, a sealing process is complicated. Since the lower sealant 2 emits heat, the conventional power module package is disadvantageous in view of the material and thickness of the lower sealant 2.

SUMMARY OF THE INVENTION

The present invention provides a stack type power module having reduced size and improved operational characteristics due to the reduced size and a method of fabricating the stack type power module.

According to an aspect of the present invention, there is provided a power module having a stacked flip-chip, including a lead frame; a control device part including a control device chip; a power device part including a power device chip and being electrically connected to the lead frame; and an interconnecting substrate of which the control and power device parts are respectively disposed at upper and lower portions, and each of the control and power device chips may be attached to one of the lead frame and the interconnecting substrate using a flip-chip bonding method.

The power module may further include a thermal substrate which emits heat generated from the power device part. A copper (Cu) thin film may be stacked on a ceramic substrate to form the thermal substrate.

The lead frame may include first and second lead frame portions, the first lead frame portion may have a long portion extends underneath the interconnecting substrate and the second lead frame portion that may have a short portion that extends on (e.g., on top of) the interconnecting substrate, the power device part may be disposed between the first lead frame portion and the thermal substrate, and the power device chip of the power device part may be attached to a lower surface of the first lead frame portion using a flip-chip bonding method. The first lead frame portion may be divided into lower and upper portions to have a predetermined bending depth, and the lower portion of the first lead frame portion may long extend underneath the interconnecting substrate. A convex type bump may be formed on the lower portion of the first lead frame portion to combine the first lead frame portion with the power device chip. Upper and lower boards may be attached to each other to form the interconnecting substrate, and predetermined patterns may be formed on the lower board of the interconnecting substrate so as to dispose the first lead frame portion among the predetermined patterns.

The power device chip of the power device part may be adhered onto the thermal substrate through a solder adhesive of solder wire or solder paste type. The control device chip of the control device part may be attached to an upper surface of the interconnecting substrate using a flip-chip bonding method. The power and control device chips may be attached to one of the interconnecting substrate and the first lead frame portion using one of a bump structure, a solder structure, and a bump and solder structure.

The power and control device chips may be attached to one of the interconnecting substrate and the first lead frame portion using one of the bump and solder structure and the solder structure, and one of the bump and solder structure and the solder structure may include a structure which includes one of a bump which is formed on a pad of the chips and a solder material which encloses the bump and is formed between the chip and one of the interconnecting substrate and the first lead frame portion; a first bump which is formed on the pad of the chip, a second bump which is formed on one of the interconnecting substrate and the first lead frame portion, and a solder material which encloses the first and second bumps and is formed between the chip and one of the interconnecting substrate and the first lead frame portion; a stack type bump which is formed on the pad of the chip and a solder material which encloses the stack type bump and is formed between the chip and one of the interconnecting substrate and the first lead frame portion; a stack type bump which is formed on one of the interconnecting substrate and the first lead frame portion and a solder material which encloses the stack type bump and is formed between the chip and one of the interconnecting substrate and the first lead frame portion; a solder material which is formed between the pad of the chip and one of the interconnecting substrate and the first lead frame portion; and a bump which is formed on one of the interconnecting substrate and the first lead frame portion and a solder material which encloses the bump and is formed on the chip and one of the interconnecting substrate and the first lead frame portion. The bump may be formed of one of copper (Cu) and gold (Au) in a convex structure, and if the bump is of stack type, the bumps may include two bumps including protrusions which are attached to each other so that they face each other or away from each other.

The power and control device chips may be attached to one of the interconnecting substrate and the first lead frame portion using a bump structure, and the bump structure may include a structure which includes one of a first bump which is formed on a pad of the chip and a second bump which is connected to the first bump and formed on one of the interconnecting substrate and the first lead frame portion; a first bump which is formed on the pad of the chip, one of plate-shaped aluminum (Al) bump and pattern which is formed on one of the interconnecting substrate and the first lead frame portion, and a second bump which is formed between the first bump and one of the plate-shaped Al bump and pattern; a first bump which is formed on the pad of the chip and a tin (Sn) plated plate which is connected to the first bump and formed on one of the interconnecting substrate and the first lead frame portion; and a first bump which is formed on the pad of the chip, a second bump which is formed on the first bump, and a Sn plated plate which is connected to the second bump and formed on one of the interconnecting substrate and the first lead frame portion. The first and second bumps may be formed of one of Cu and Au in convex structures and may include protrusions which are attached to each other so that they face toward or away from each other. An under bump metal (UBM) may be formed on the pad of the chip.

The lead frame may operate as a thermal substrate, and the power device chip of the power device part may be disposed between the interconnecting substrate and the lead frame. The power device chip of the power device part may be adhered onto the lead frame through a solder adhesive of solder wire or solder paste type and may be attached to a lower surface of the interconnecting substrate using a flip-chip bonding method. The lead frame may be connected to the interconnecting substrate through inter-substrate solder balls. The control device chip of the control device part may be attached to an upper surface of the interconnecting substrate using a flip-chip bonding method. The power module may further include a sealant which seals the power and control device parts and may include a convex structure including a predetermined portion protruding from a lower portion of the lead frame.

According to another aspect of the present invention, there is provided a power module having a stacked flip-chip, including a control device part including a control device chip; a power device part including a power device chip; a thermal substrate on which the power device part is attached and which emits heat generated from the power device part; a lead frame which is disposed on the thermal substrate and attached to the power device chip of the power device part using a flip-chip bonding method; and an interconnecting substrate which is attached to the lead frame and on which the control device chip of the control device part is stacked using a flip-chip bonding method.

The lead frame may include first and second lead frame portions, the first lead frame portion may have a long portion that extends underneath the interconnecting substrate, and the second lead frame portion may have a short portion that extends on the interconnecting substrate. Upper and lower boards may be attached to each other to form the interconnecting substrate, and predetermined patterns may be formed on the lower board of the interconnecting substrate so as to dispose the first lead frame portion among the predetermined patterns. The first lead frame portion may be divided into lower and upper portions to have a predetermined bending depth, and the lower portion of the first lead frame portion may have a long portion that extends underneath the interconnecting substrate.

The control device part may include one of a boost diode (B.S diode) and a thermistor, and the power device part may include a diode chip. The control device chip may include low and high voltage integrated circuits (LV and HV ICs), and the power device chip may include an IGBT (insulated gate bipolar transistor) chip. The power module may have a DIP (dual in-line package) structure.

According to another aspect of the present invention, there is provided a power module having a stacked flip-chip, including a control device part including a control device chip; a power device part including a power device chip; a lead frame on which the power device part is stacked; and an interconnecting substrate which is disposed on the lead frame and of which the power device chip of the power device part and the control device chip of the control device part are respectively disposed at upper and lower portions using a flip-chip bonding method.

The lead frame may operate as a thermal substrate and may be connected to the interconnecting substrate through inter-substrate solder balls. The power module may further include a sealant which seals the power and control device parts and has a convex structure including a predetermined portion protruding from a lower portion of the lead frame. The power device chip may include a MOSFET (metal-oxide semiconductor field effect transistor).

The power module may have an SMD (surface mount device) package structure.

According to another aspect of the present invention, there is provided a method of fabricating a power module, including forming bumps on power and control device chips on a wafer level; separately sawing the power and control device chips into individual chips; adhering the power device chip onto a thermal substrate and the control device chip onto an interconnecting substrate; combining a lead frame, the thermal substrate, and the interconnecting substrate with one another in a multi-jig (or other suitable type of processing apparatus); and sealing the power and control device chips, and the control and power device chips may be attached to one of the lead frame and the interconnecting substrate using a flip-chip bonding method.

The bumps may be formed on the lead frame and the interconnecting substrate. The method may further include performing a reflow process between the combining of the lead frame, the thermal substrate, and the interconnecting substrate and the sealing of the power and control device chips; plating a predetermined portion of the lead frame outside the sealant after sealing the power and control device chips; trimming the predetermined portion of the lead frame; and performing test and packing processes. The reflow process may include a flux cleaning process.

The lead frame may include first and second lead frame portions. The first lead frame portion may have a long portion that extends underneath the interconnecting substrate and the second lead frame portion may have a short portion that extends on the interconnecting substrate, the power device part may be disposed between the first lead frame portion and the thermal substrate, and the power device chip of the power device part may be attached to a lower surface of the first lead frame portion using a flip-chip bonding method.

The power device chips may be adhered onto the thermal substrate using a solder screen print process, and the control device chips may be adhered onto the interconnecting substrate using solder balls, or a solder paste dotting or dispense, or thermal press process. The combination of the lead frame, the thermal substrate, and the interconnecting substrate may be performed using solder paste dotting or solder screen print processes.

According to another aspect of the present invention, there is provided a method of fabricating a power module, including forming bumps on power and control device chips on a wafer level; separately sawing the power and control device chips into individual chips; adhering the power device chip onto a lead frame and the control device chip onto an interconnecting substrate; combining the lead frame with the interconnecting substrate in a multi-jig; and sealing the power and control device chips; and the control and power device chips may be respectively attached to the interconnecting substrate and the lead frame using a flip-chip bonding method.

The lead frame may operate as a thermal substrate, and the power device chip of the power device part may be disposed on the lead frame and underneath the interconnecting substrate using a flip-chip bonding method. A sealant may be formed underneath the lead frame so that a predetermined portion of the sealant protrudes so as to fabricate the power module in a convex structure.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

Figure 1:
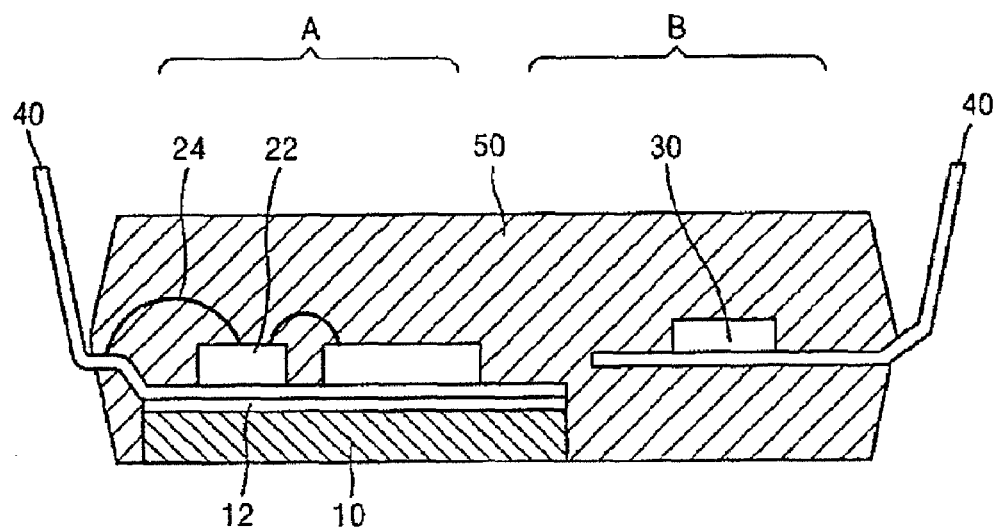
FIG. 1 is a cross-sectional view of a conventional power module package.
Figure 2:
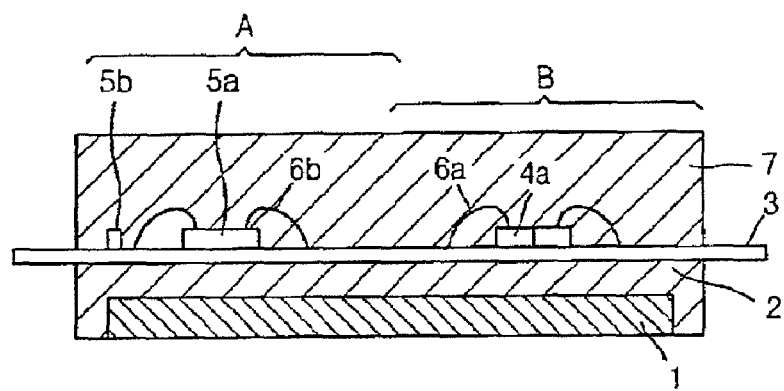
FIG. 2 is a cross-sectional view of another power module package.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present.

Figure 3:
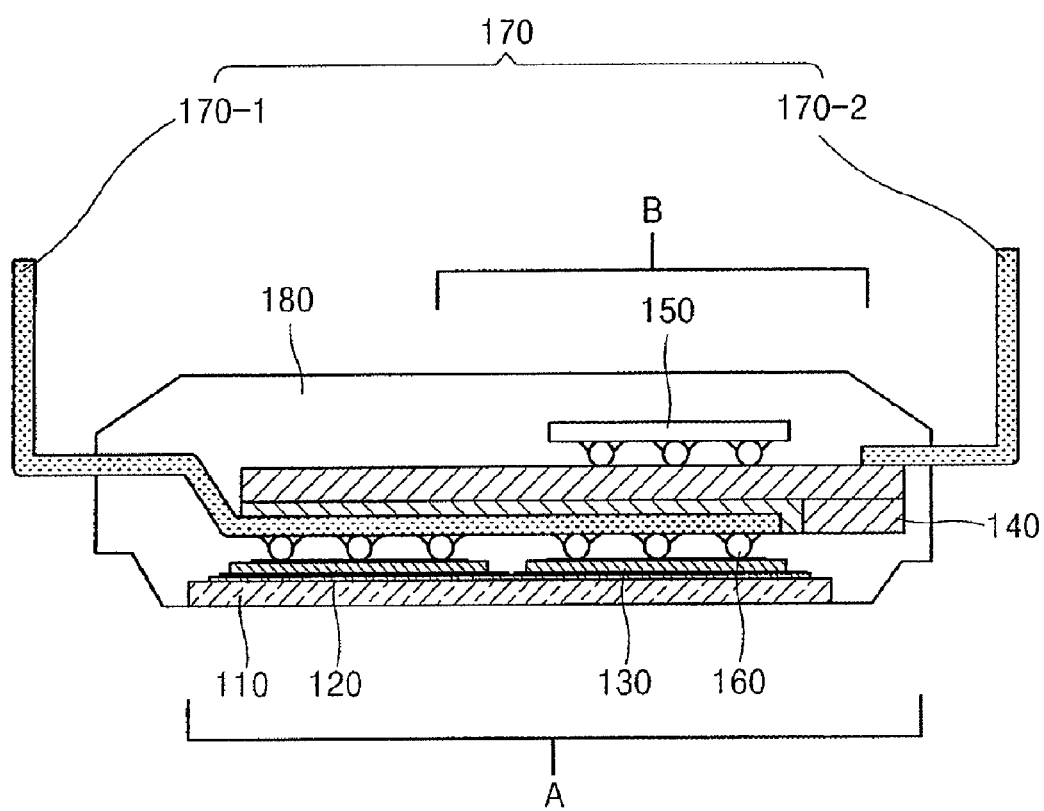
FIG. 3 is a cross-sectional view of a power module with a stacked flip-chip according to an embodiment of the present invention.

FIG. 3 is a cross-sectional view of a power module having a stacked flip-chip according to an embodiment of the present invention. Referring to FIG. 3, the power module of the present embodiment includes a power device part A, a control device part B, a thermal substrate 110, a lead frame 170, and an interconnecting substrate 140. The power device part A includes a power device chip 120. The control power device B includes a control device chip 150. Chips of the power device part A are stacked on the thermal substrate 110. The chips of the power device part A are attached to one another on the lead frame 170 using a flip-chip bonding method. The interconnecting substrate 140 is attached to the lead frame 170 to support the power module and combine chips of the control device part B using a flip-chip bonding method. The chips of the power and control device parts A and B, a portion of the lead frame 170, and the interconnecting substrate 140 are sealed by a sealant 180 such as an epoxy molding compound (EMC). Also, the chips of the power device part A are attached to the lead frame 170 through solder 160 using the flip-chip bonding method, and the chips of the control device part B are attached to the interconnecting substrate 140 through solder 160 using the flip-chip bonding method.

For example, the chips of the power device part A may be an insulated gate bipolar transistor (IGBT), a diode, etc., and the chips of the control device part B may be a low voltage integrated chip (LVIC), a high voltage integrated chip (HVIC), a boost (B.S) diode, a negative temperature coefficient (NTC) thermistor, etc. A plurality of resistor, inductor, capacitor (R.L.C.) devices may be disposed on each device part to drive a device.

The power module of the present embodiment can include an interconnecting substrate for stacking thereon power device chips or control device chips only using a flip-chip bonding method so as to desirably reduce the size of the power module. The power module has a dual in-line package (DIP) structure but may have a single in-line package (SIP) or quadruple in-line package (QID) structure, or the like. Elements of the power module of the present embodiment will now be described in detail with reference to the drawings.

Figure 4A:
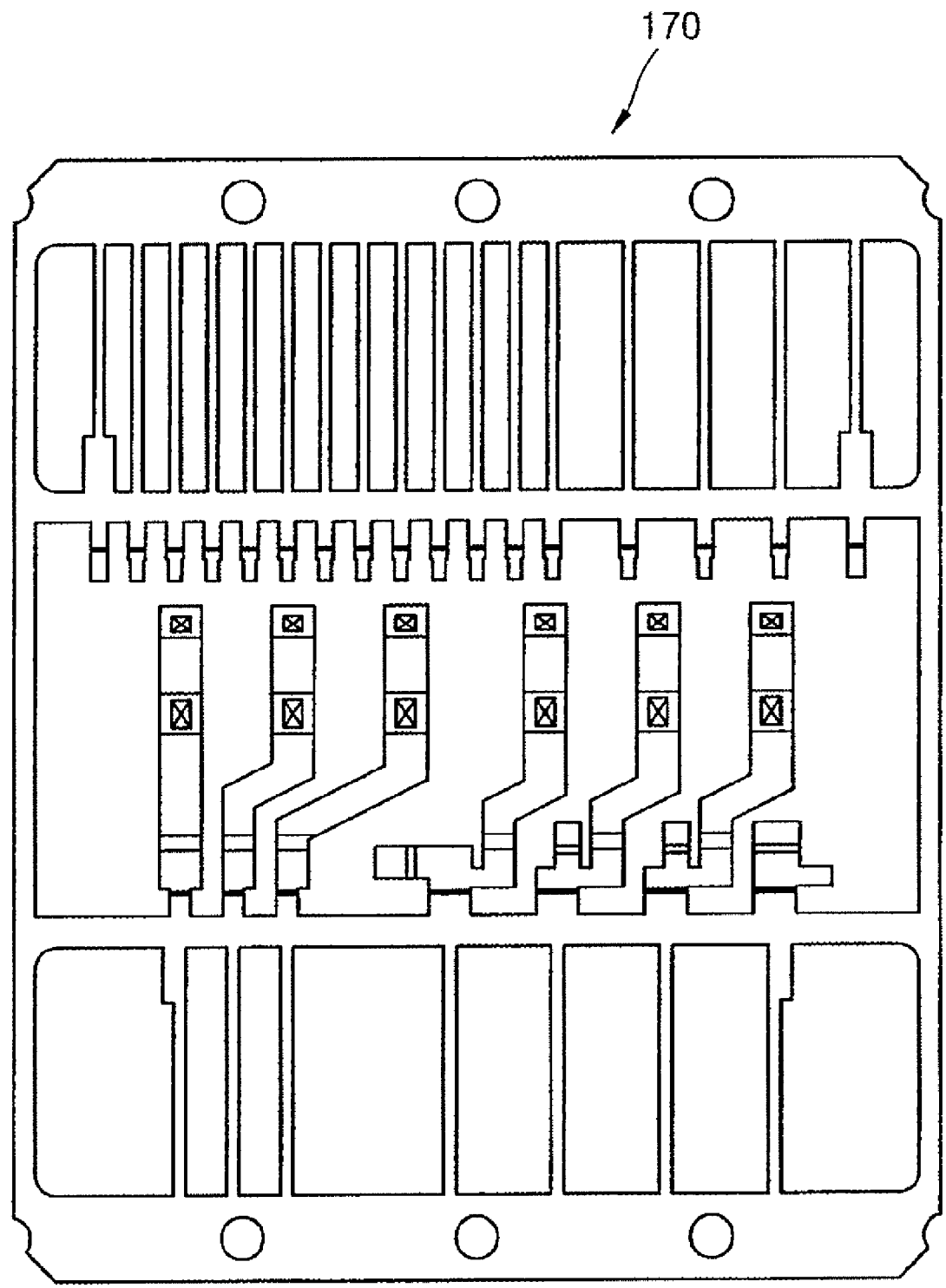
FIGS. 4A through 4C are plan views and a side view illustrating a lead frame of FIG. 3 in more detail.
Figure 4B:
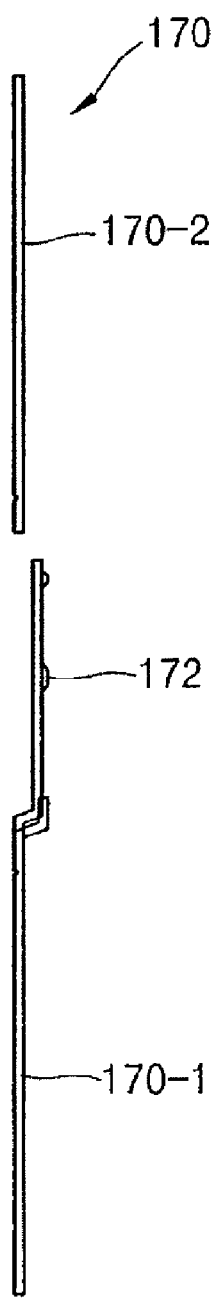
Figure 4C:
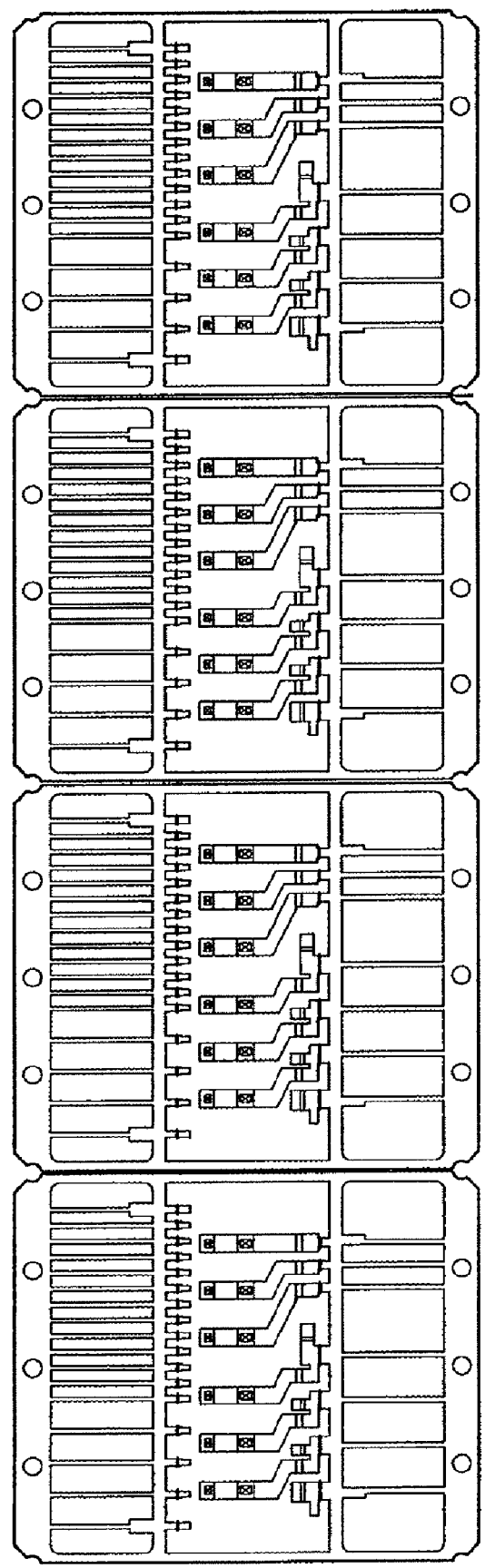

FIGS. 4A through 4C are plan views and a side view illustrating in more detail the lead frame 170 of FIG. 3.

FIG. 4A is a plan view illustrating an upper surface of the lead frame 170 of the power module of the present embodiment. Referring to FIG. 4a, a plurality of wires are formed on the lead frame 170. The lead frame 170 entirely supports the power module and operates as an interconnector which electrically connects devices mounted on the lead frame 170 to an external main board, etc.

FIG. 4B is a side view of the lead frame 170. Referring to FIG. 4B, the lead frame 170 is divided into first and second lead frame portions 170-1 and 170-2. The first and second lead frame portions 170-1 and 170-2 are separately illustrated in FIG. 4B to show the division of the lead frame 170 into the first and second lead frame portions 170-1 and 170-2. In other words, a connection portion between the first and second lead frame portions 170-1 and 170-2 of FIG. 4A is omitted herein.

The first lead frame portion 170-1 is formed to a predetermined bending depth, and convex bumps 172 may be formed underneath the first lead frame portion 170-1 to solder chips to the first lead frame portion 170-1. The convex bumps 172 are formed to prevent short-circuit from occurring when combining the chips to the first lead frame portion 170-1 using a flip-chip bonding method. Thus, if the likelihood of short-circuit occurring is low, the convex bumps 172 may be omitted.

The lead frame 170 of the present embodiment may have a unit size of about $43.6 \times 52.7$ mm$^2$ and a thickness between 0.38 mm and 0.40 mm, and the predetermined bending depth of the first lead frame portion 170-1 may be about 0.81 mm to the power chips, but about 1.06 mm to the thermal substrate 110. The lead frame 170 may be formed of a thermally conductive material such as copper or the like.

FIG. 4C is a plan view illustrating a lead frame having a strip size of about $175.6 \times 52.7$ mm$^2$, wherein four lead frames each having a unit size are connected to one another to form the lead frame having the strip size.

The lead frame 170 of the present embodiment has a similar structure to a conventional lead frame. However, since chips are attached to the lead frame 170 using a flip-chip bonding method, any space for wire bonding can be omitted. Thus, the size of the lead frame 170 can be sufficiently reduced compared to when the wire bonding is used.

Figure 5A:
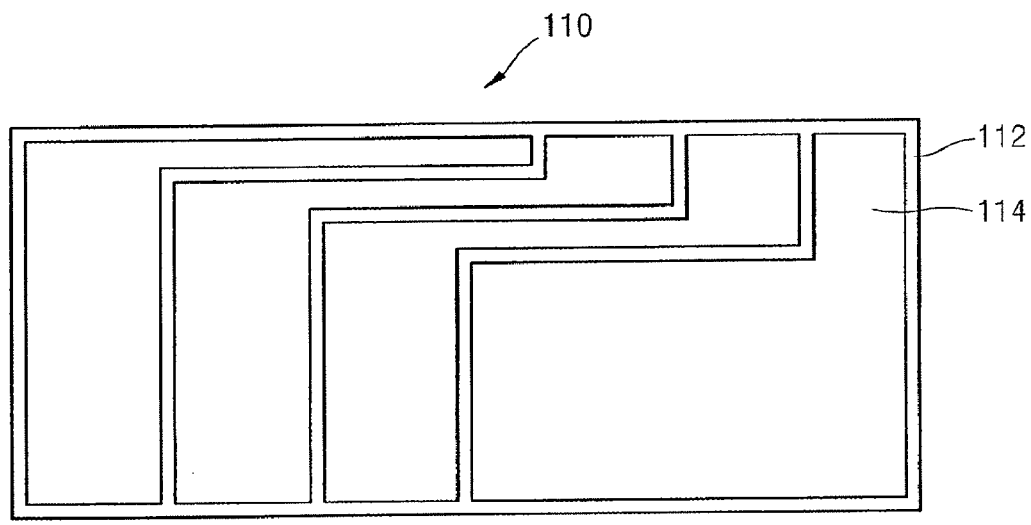
FIGS. 5A and 5B are a plan view and a side view illustrating a structure of a thermal substrate of FIG. 3.
Figure 5B:
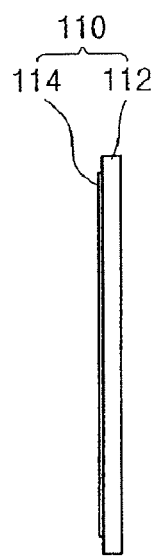

FIGS. 5A and 5B are a plan view and a side view illustrating in more detail the thermal substrate 110 of FIG. 3. Referring to FIG. 5A, the thermal substrate 110 is formed in a rectangular shape and has a predetermined pattern for insulating devices including power device chips from one another. FIG. 5B is a side view illustrating the thermal substrate 110 formed of two layers. Referring to FIG. 5B, the thermal substrate 110 includes a ceramic substrate 112 and a copper thin film 114. The copper thin film 114 has a predetermined pattern as shown in FIG. 5A and effectively emits heat generated from the devices.

In the present embodiment, the thermal substrate 110 includes the ceramic substrate 112 and the copper thin film 114 but is not limited thereto. Alternatively, the thermal substrate 110 may be formed of a different material in a different layer form.

Figure 5C:
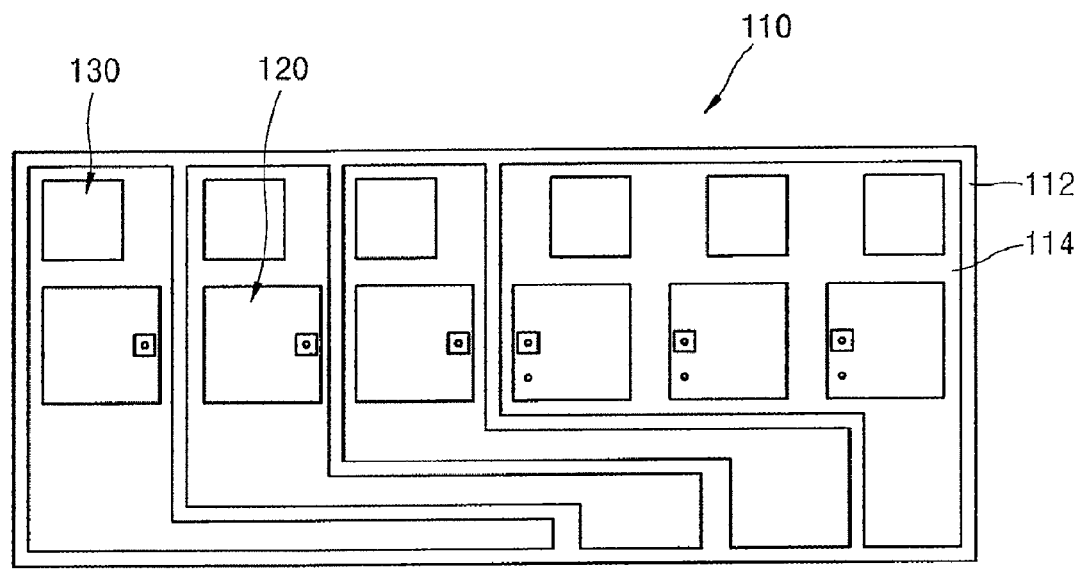
FIGS. 5C and 5D are a plan view and a side view illustrating power device chips and diodes stacked on a thermal substrate of FIG. 5A.
Figure 5D:
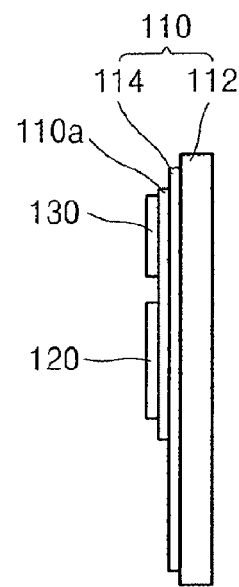

FIGS. 5C and 5D are respectively a plan view and a side view illustrating power device chips and diodes stacked on the thermal substrate 110 of FIG. 5A. Referring to FIG. 5C, chips of a power device part, e.g., IGBTs and diodes 130, are mounted on the copper thin film 114. FIG. 5D is a side view of FIG. 5C. Referring to FIG. 5D, the IGBTs and the diodes 130 are stacked on the thermal substrate 110.

Figure 5E:
FIG. 5E is a detailed side view illustrating the thermal substrate of FIG. 5B.

FIG. 5E is a side view illustrating the thermal substrate 110 of FIG. 5B in more detail. Referring to FIG. 5E, the thermal substrate 110 may be formed of various materials in various structures. For example, the thermal substrate 110 may be formed of thick film copper (TFC), a printed circuit board (PCB), a flexible PCB (FPCB), an insulated metal substrate (IMS), a pre-molded substrate, direct bonded copper (DBC), ceramic, or the like. In the present embodiment, the thermal substrate 110 has a TFC structure.

The thermal substrate 110 having the TFC structure is formed of the ceramic substrate 112 and the copper thin film 114 formed on the ceramic substrate 112. The ceramic substrate 112 may be formed of $Al_2O_3$ ceramic to a thickness of about 0.635 mm, and the copper thin film 114 may be formed to a thickness of about 0.1 mm. An entire size of the thermal substrate 110 formed as described above has a width of $32.5 \times 14.0$ mm$^2$ and a thickness of about 0.735 mm. However, the size of the thermal substrate 110 is not limited thereto but may depend on a number or characteristics of stacked devices or the entire size of the power module.

Figure 5F:
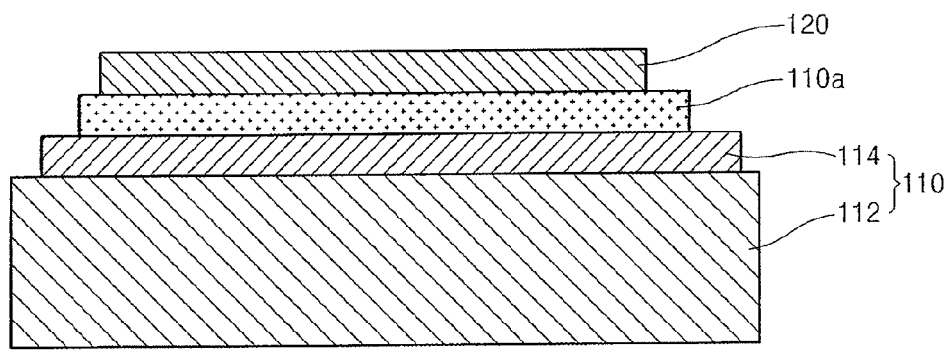
FIG. 5F is a side view illustrating in more detail power device chips of FIG. 5D.

FIG. 5F is a side view illustrating the power device chips of FIG. 5D in more detail. Referring to FIG. 5F, a power device chip 120 such as an IGBT, a diode, or the like are stacked on the thermal substrate 110 including the ceramic substrate 112 and the copper thin film 114. The power device chip 120, the diode, or the like has a thickness of about 0.1 mm and is stacked on the thermal substrate 110 through a solder adhesive 110a. The solder adhesive 110a may be solder paste, solder wire, or the like.

FIGS. 6A through 6D are plan views and side views illustrating the interconnecting substrate 140 of FIG. 3.

Figure 6A:
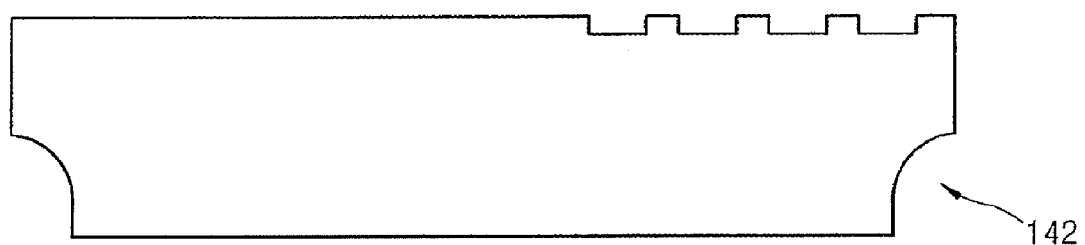
FIGS. 6A through 6D are plan views and a side view illustrating a separated interconnecting substrate of FIG. 3.
Figure 6B:
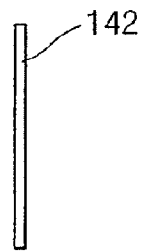

FIG. 6A illustrates an upper board 142 of the interconnecting substrate 140. Referring to FIG. 6A, the upper board 142 may be formed of various materials including a TFC, a PCB, a FPCB, an IMS, a pre-molded substrate, a DBC, ceramic, etc. Although not shown, wires are formed to electrically connect mounted chips. FIG. 6B is a side view of the upper board 142 of FIG. 6A. Referring to FIG. 6b, the upper board 142 is formed to a thickness of about 0.4 mm.

Figure 6C:
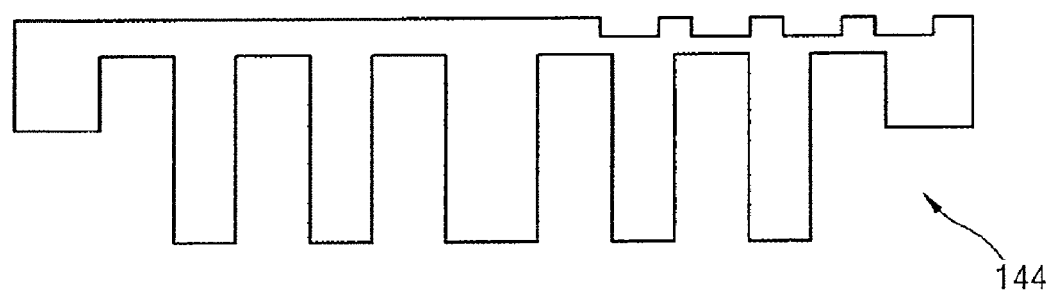
Figure 6D:
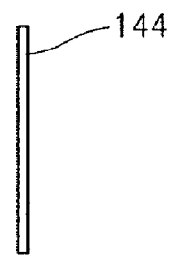

FIG. 6C illustrates a lower board 144 of the interconnecting substrate 140. Referring to FIG. 6C, the lower board 144 may be formed of the same material as that of the upper board 142. The upper board 142 is different from the lower board 144 in that it has predetermined patterns. As shown in FIG. 6C, the first lead frame portion 170-1 of the lead frame 170 is disposed between the predetermined patterns of the lower board 144. FIG. 6D is a side view of the lower board 144 of FIG. 6C. Referring to FIG. 6D, the lower board 144 is formed to a thickness about 0.4 mm like the upper board 142.

Figure 6E:
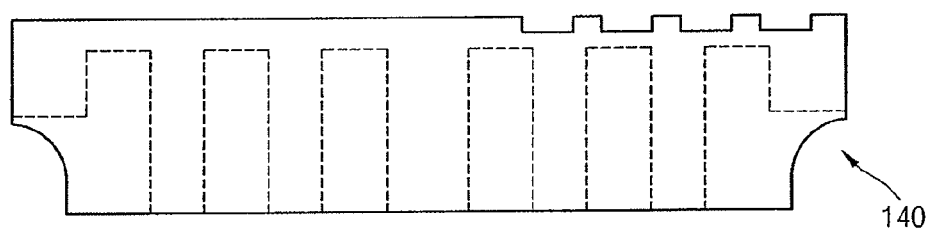
FIGS. 6E and 6F are a plan view and a side view illustrating combined upper and lower interconnecting substrates of FIGS. 6A and 6C.
Figure 6F:

FIGS. 6E and 6F respectively show a plan view and a side view illustrating the upper and lower boards 142 and 144 of the interconnecting substrate 140, which are attached to each other.

Referring to FIG. 6E, the upper and lower boards 142 and 144 are attached to each other to complete the interconnecting substrate 140. Thus, the interconnecting substrate 140 has a thickness of about 0.8 mm and a lower portion having predetermined patterns is formed by the lower board 144. The predetermined patterns of the lower board 144 are marked with dotted lines.

The interconnecting substrate 140 may have a size of 37.4× 8.70 mm² and a thickness of 0.8 mm. The interconnecting substrate 140 is attached to the lead frame 170 to entirely support the power module, and chips of a control device part are mounted on the interconnecting substrate 140 as described above. Thus, the size and structure of the interconnecting substrate 140 may depend on a number of mounted chips or a structure of a lead frame attached to the interconnecting substrate 140.

Figure 6G:
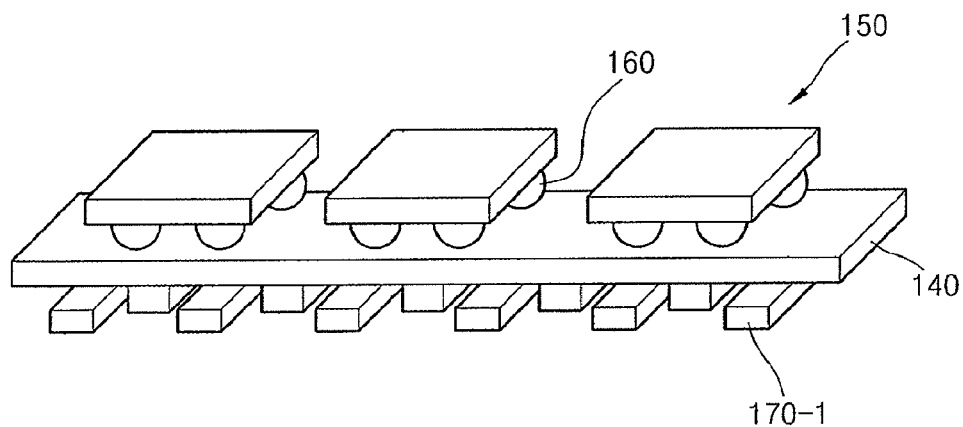
FIGS. 6G and 6H are a perspective view and a plan view illustrating control device chips mounted on the interconnecting substrate.
Figure 6H:
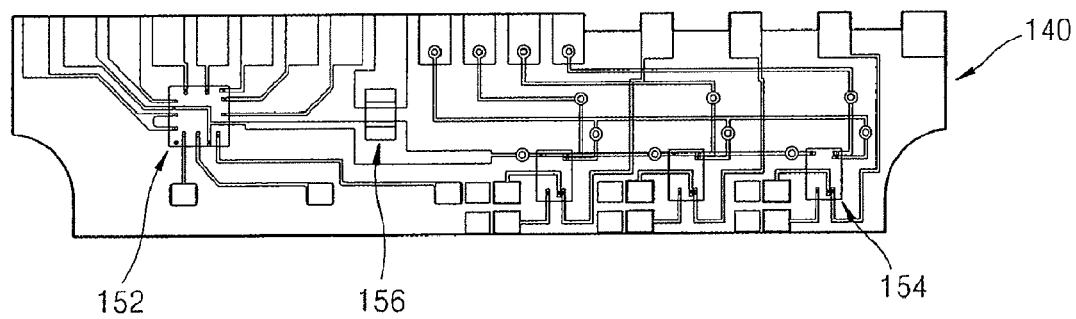

FIGS. 6G and 6H are a perspective view and a plan view illustrating control device chips mounted on the interconnecting substrate 140.

Referring to FIG. 6G, chips and the lead frame 170 are attached to the interconnecting substrate 140. In other words, the control device chips 150 are mounted on the interconnecting substrate 140 through the solder 160 using the flip-chip bonding method, and the first lead frame portion 170-1 is disposed among the patterns of the lower board 144 of the interconnecting substrate 140.

FIG. 6H is a plan view illustrating chips of a control device part mounted on the interconnecting substrate 140. For example, a low voltage integrated chip (LVIC) 152, a high voltage IC (HVIC) 154, and a boost diode 156 or negative temperature coefficient (NTC) thermistor are stacked on the interconnecting substrate 140 and can be connected to wire lines.

Figure 7A:
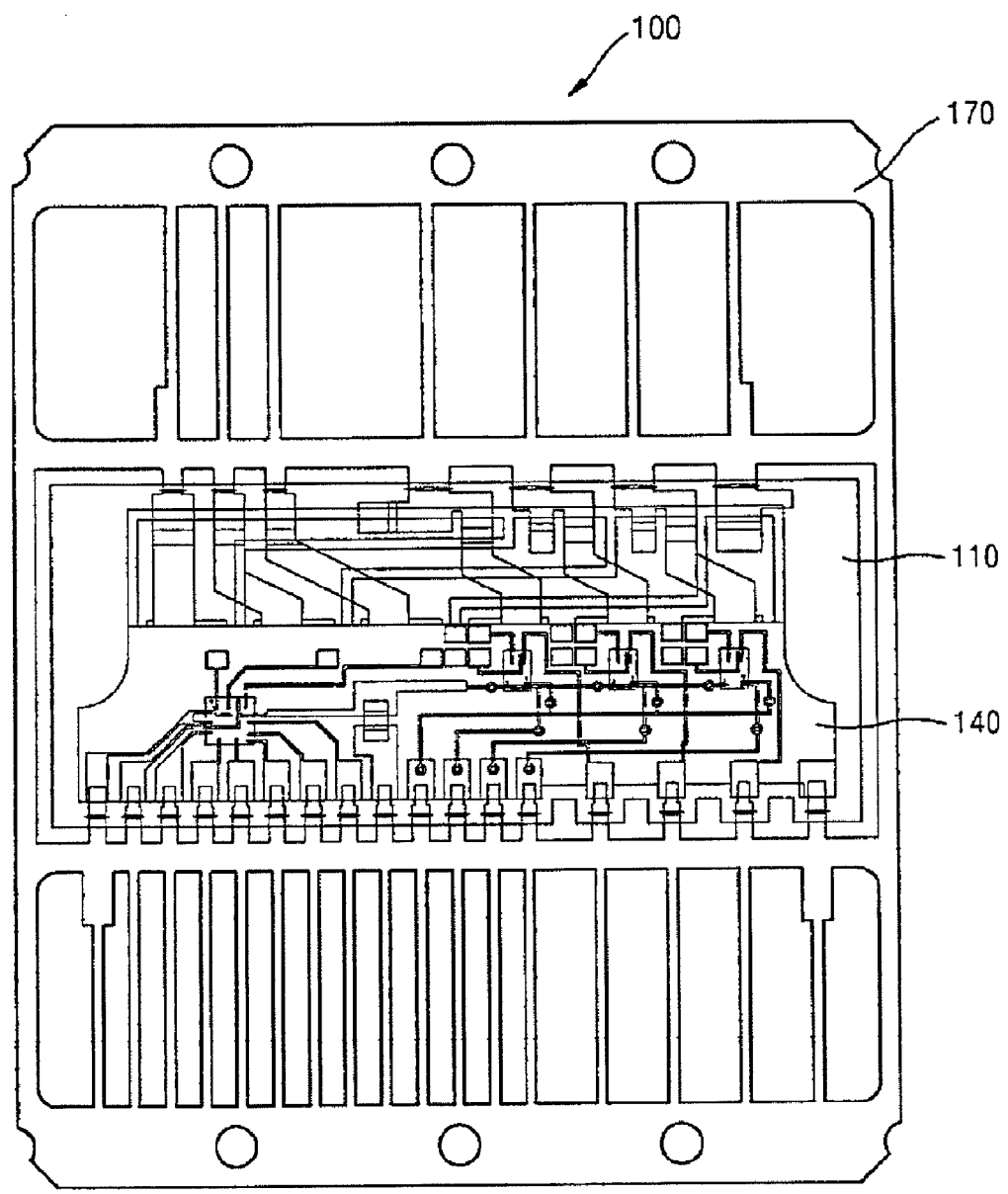
FIGS. 7A and 7B are a plan view and a side view illustrating the power module of FIG. 3 in more detail.
Figure 7B:
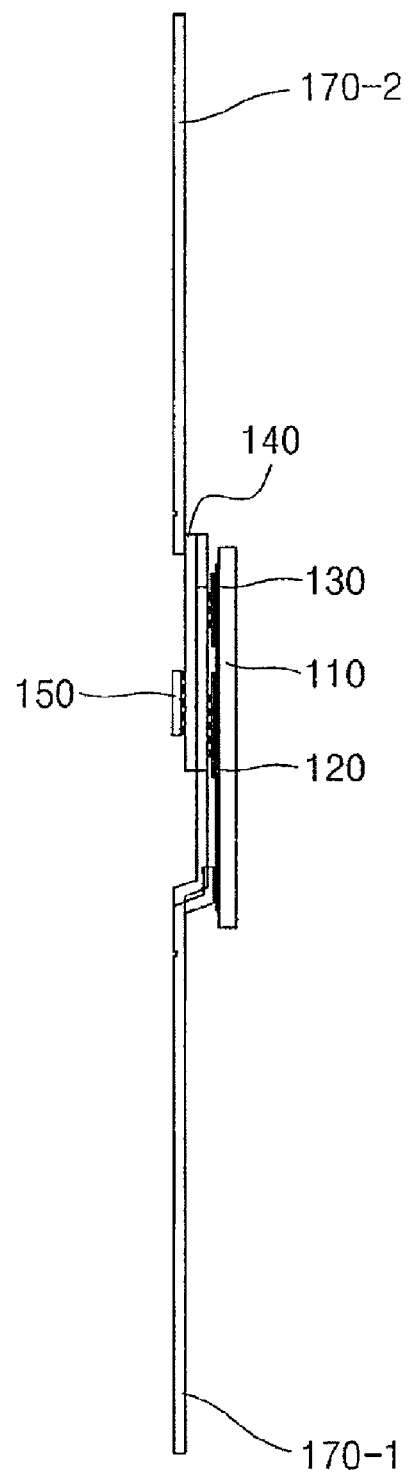

FIGS. 7A and 7B are a plan view and a side view illustrating in more detail the power module of FIG. 3.

FIG. 7A is a plan view illustrating an upper surface of the power module 100 having a unit size. Referring to FIG. 7A, the thermal substrate 110, the lead frame 170, and the interconnecting substrate 140 are attached to each other. The chips of the control device part are stacked on the interconnecting substrate 140 using the flip-chip bonding method, and the chips of the power device part are stacked between the lead frame 170 and the thermal substrate 110 underneath the interconnecting substrate 140 using the flip-chip bonding method.

The power module of the present embodiment including chips stacked using the flip-chip bonding method has a reduced size compared to the conventional power module. For example, the size of the power module of the present embodiment can be reduced by about 45% compared to an SPM3-V4 type of package having a size of 44.0×26.8×5.5 mm³. In other words, the power module of the present embodiment may be fabricated to a size of 38.0×17.0×3.0 mm³.

FIG. 7B is a side view of the upper surface of the power mode of FIG. 7A having a similar stack structure to the power module of FIG. 3. In other words, FIG. 7B illustrates a power module which is not molded. Thus, the power module of the present embodiment is slightly different from the power module of FIG. 3 in terms of lead frame.

In brief, an IGBT and a diode 130 of a power device part are stacked on the thermal substrate 110, and chips of the power device part are attached to the lead frame 170, i.e., the first lead frame portion 170-1, using a flip-chip bonding method. The first lead frame portion 170-1 of the lead frame 170 is attached to a lower surface of the interconnecting substrate 140, and the second lead frame portion 170-2 is attached to an upper surface of the interconnecting substrate 140. A chip 150 of a control device part is attached to the upper surface of the interconnecting substrate 140 using a flip-chip bonding method.

Figure 8:
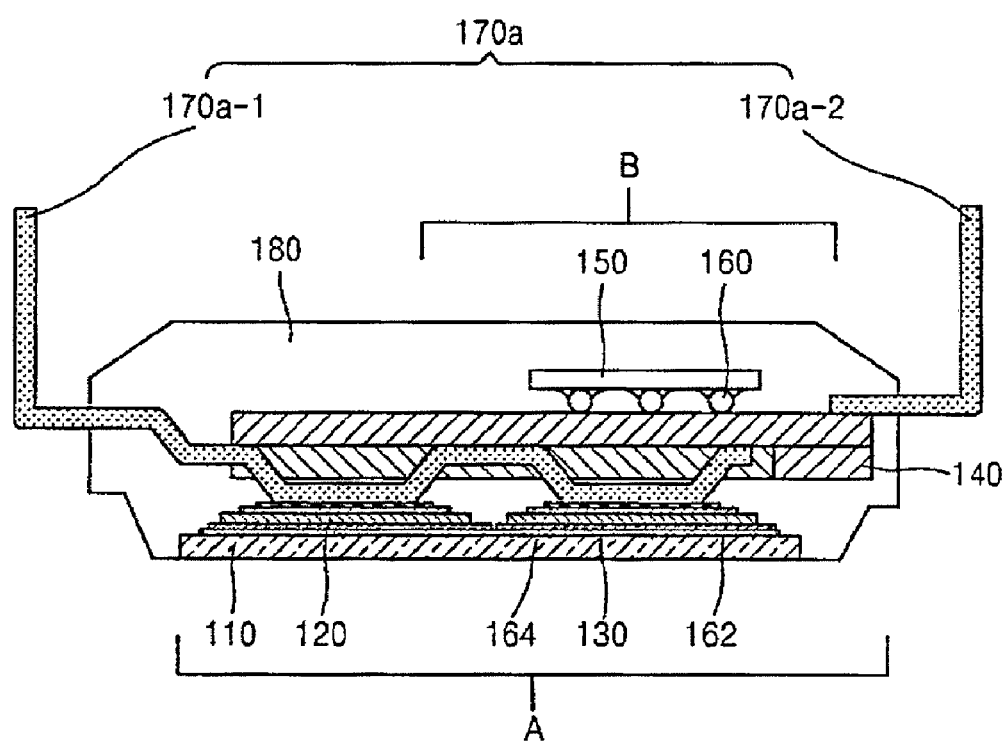
FIG. 8 is a cross-sectional view of a power module having a stacked flip-chip according to another embodiment of the present invention.

FIG. 8 is a cross-sectional view of a power module with a stacked flip-chip according to another embodiment of the present invention. Referring to FIG. 8, similarly to the power module of FIG. 3, the power module of the present embodiment includes a power device part A, a control device part B, a thermal substrate 110, lead frame 170a, and an interconnecting substrate 140. The power device part A includes a power device chip 120. The control device part B includes a control device chip 150. Chips of the power device part A are stacked on the thermal substrate 110 and attached to the lead frame 170a using a flip-chip bonding method. The interconnecting substrate 140 is attached to the lead frame 170a to entirely support the power module and chips of the control device part B using a flip-chip bonding method.

The lead frame 170a has a different structure of the lead frame 170 of the previous embodiment, and a method of combining the chips of the power device part A with the lead frame 170a is also different from that of previous embodiment.

In more detail, a first lead frame portion 170a-1 of the lead frame 170a has a W shape (or undulating shape) and is attached to a lower board of the interconnecting substrate 140. A bonding strength between the first lead frame portion 170a-1 and the interconnecting substrate 140 can be further strengthened through the combination between the first lead frame portion 170a-1 and the interconnecting substrate 140. The first lead frame portion 170a-1 is not limited to a linear shape in the previous embodiment or the W shape but may be modified into various forms.

Chips 120 and 130 of the power device part A are attached to the first lead frame portion 170a-1 through solder adhesives 164 such as solder wires or solder paste. Metal wire layers 162 are formed on upper surfaces of the chips 120 and 130. They can be used to bond the chips 120 and 130 to the first lead frame portion 170a-1 using the solder adhesives 164. The metal wire layers 162 may be formed of various materials such as Al/Ni, Al/Ni/Ag, Al/Electroless Nickel-Immersion Gold (ENIG)-bumps, Al/TiCuNiAu-bumps, etc., to appropriate thicknesses. For example, if the metal wire layers 162 are formed of dual layers of Al/Ni, the metal wire layers 162 may be formed of aluminum layers having a thickness of about 4 μm and nickel layers having a thickness of about 2000 Å. If the metal wire layers 162 are formed of triple layers of Al/Ni/Ag, the metal wire layers 162 may be formed of aluminum layers having a thickness of about 4 μm, nickel layers having a thickness of about 2000 Å, and sliver layers having a thickness of about 1500 Å.

The materials and structures of other elements are the same as described in the previous embodiment. The lower board of the interconnecting substrate 140 may have a different structure from the lower board 144 of the previous embodiment depending on the structure of the first lead frame portion 170a-1.

FIGS. 9A through 9J are cross-sectional views illustrating bump structures combining a semiconductor chip of FIG. 3 with an interconnecting substrate or a lead frame according to embodiments of the present invention.

FIGS. 9A through 9F are cross-sectional views illustrating bump structures in which a chip is mounted on a substrate through a bump and solder or only solder.

Figure 9A:
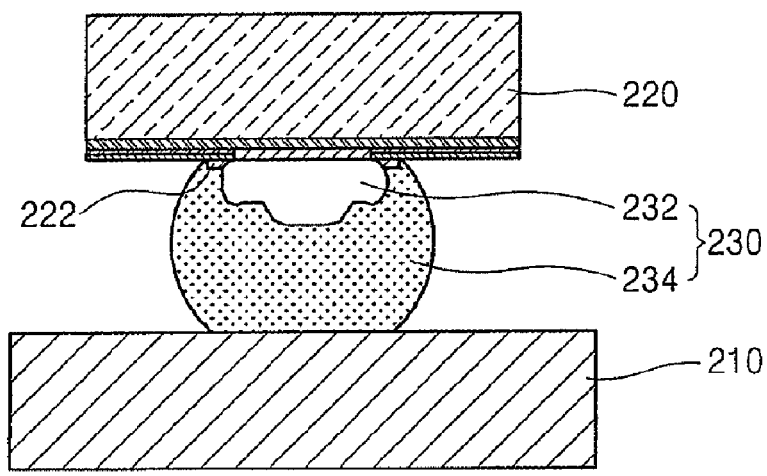
FIGS. 9A through 9J are cross-sectional views illustrating bump structures combining a semiconductor chip of FIG. 3 with an interconnecting substrate or a lead frame according to embodiments of the present invention.

A bump structure 230 of FIG. 9A includes a bump 232 which is formed at a pad 222 of a chip 220 and solder 234 which encloses the bump 232 and combines the chip 220 with a substrate 210. The pad 222 is formed at a portion of a passivation layer formed on an active layer of the chip 220, and the solder 234 is formed to a spherical shape, i.e., a ball shape. The bump 232 may be formed of copper (Cu) or gold (Au) but is not limited thereto. The bump 232 may be formed in a convex shape so that a portion thereof protrudes but may be formed in a different shape. The substrate 210 may be an interconnecting substrate or a lead frame.

Figure 9B:
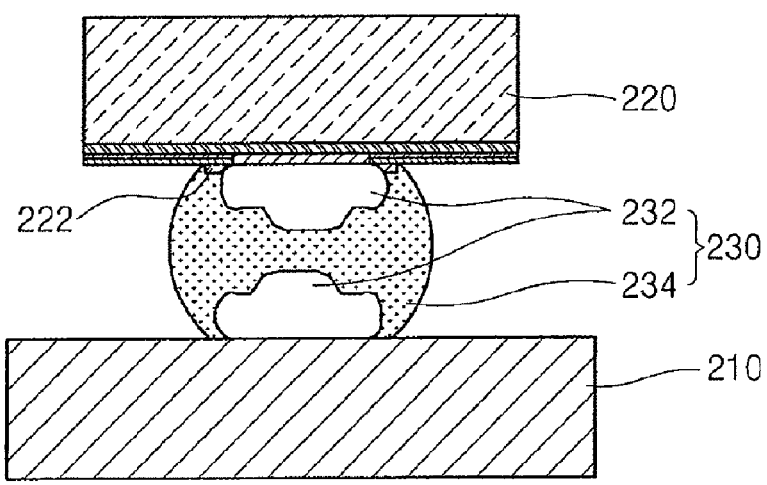

A bump structure 230 of FIG. 9B includes bumps 232 which are respectively formed on a pad of a chip 220 and a substrate 210 and solder 234 which encloses the bumps 232 and connects the chip 220 to the substrate 210. The bumps 232 are formed on the chips 220 and the substrate 210 in convex shapes so that their protrusions face each other.

Figure 9C:
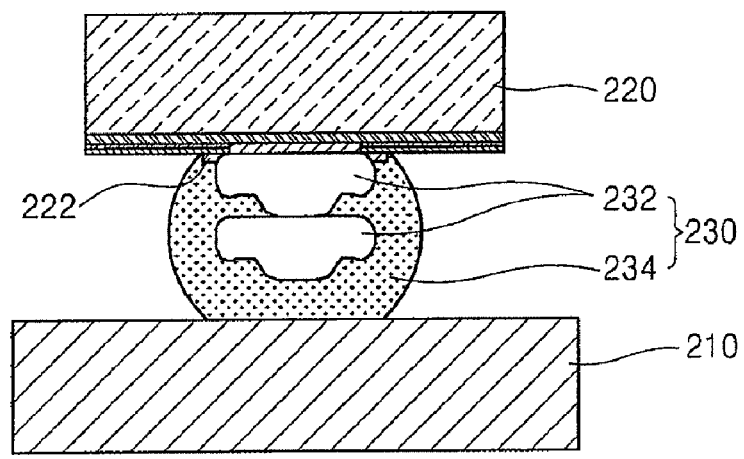

A bump structure 230 of FIG. 9C includes a stack type bump 232 which is formed at a pad of a chip 220 and solder 234 which encloses the stack type bump 232 and connects the chip 220 to a substrate 210. The stack type bump 232 includes two convex shape bumps having protrusions facing in the same direction.

Figure 9D:
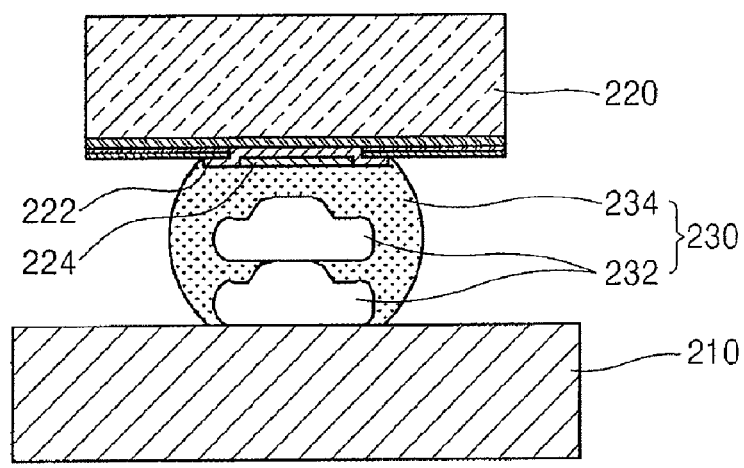

A bump structure 230 of FIG. 9D includes a stack type bump 232 which is formed on a substrate 210 and solder 234 which encloses the stack type bump 232 and connects the substrate 210 to a pad 222 of the chip 220. An under bump metal (UBM) 224 may be formed under the pad 222 of the chip 220.

Figure 9E:
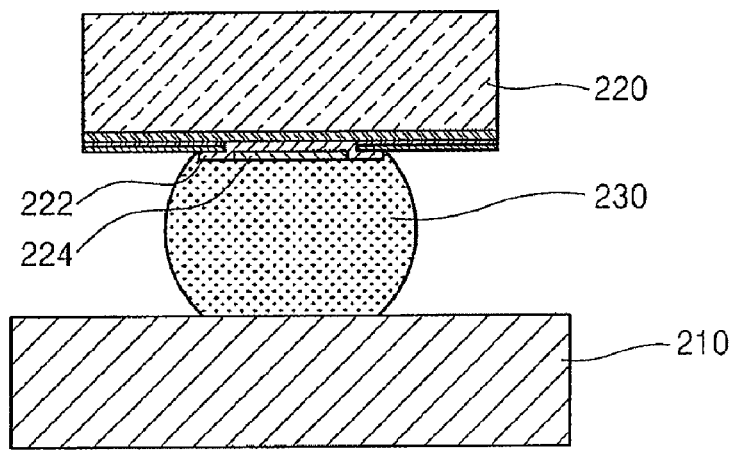

A bump structure 230 of FIG. 9E includes only solder 230 which connects a substrate 210 to a pad 222 of a chip 220. A UMB 224 may be formed under the pad 222 of the chip 220.

Figure 9F:
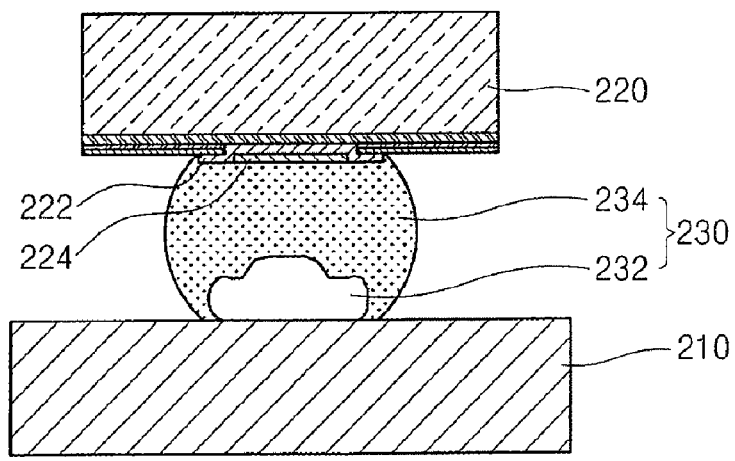

A bump structure 230 of FIG. 9F includes a bump 232 which is formed on a substrate 210 and solder 234 which encloses the bump 232 and connects the substrate 210 to a pad 222 of a chip 220. A UBM 224 may be formed under the pad 222 of the chip 220.

FIGS. 9A through 9F illustrate bump structures including bumps and solder or only solder. However, the bump structures are not limited thereto. In other words, a UBM may be selectively formed on a pad, and a bump structure may be formed in a different structure not in a convex structure. Also, a stack type bump may be combined in a different shape.

FIGS. 9G through 9J illustrate bump structures including only bumps for mounting a chip on a substrate.

Figure 9G:
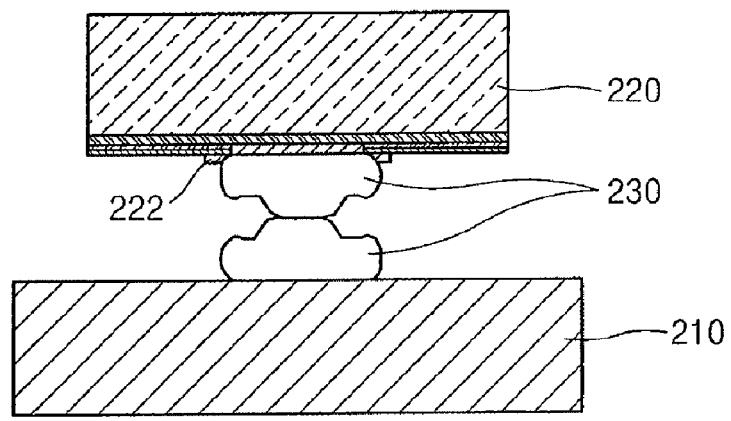

Bump structures 230 of FIG. 9G are respectively stacked on a pad 222 of a chip 220 and a substrate. The bump structures 230 have convex structures and protrusions which are attached to each other to combine the bumps structures 230.

Figure 9H:
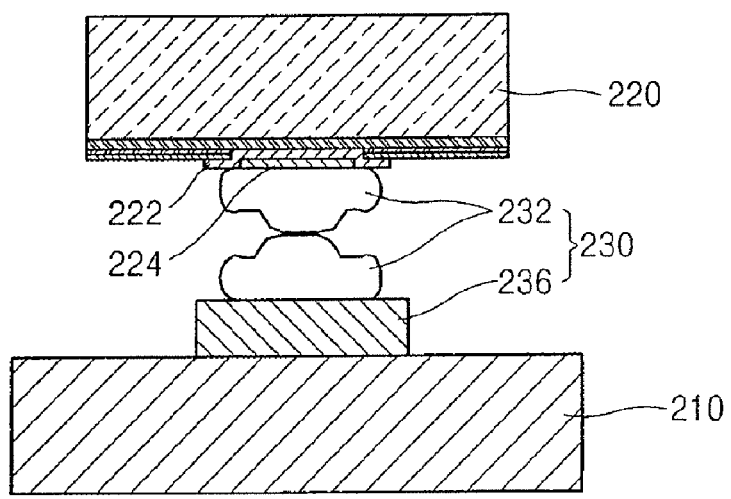

A bump structure 230 of FIG. 9H includes stack type bumps 232 and an aluminum bump or pattern 236 which is formed on a substrate 210. The stack type bumps 232 have convex shapes and can be attached to each other through their protrusions as illustrated in FIG. 9G. One of the stack type bumps 232 is formed on a pad 222 of a chip 220, and the other one is formed on the aluminum bump or pattern 236. A UMB 224 may be formed under the pad 222 of the chip 220.

Figure 9I:
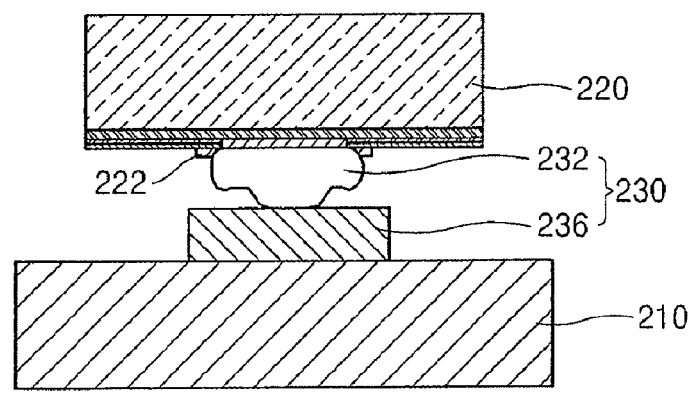

A bump structure 230 of FIG. 9I includes a bump 232 which is formed on a pad 222 of a chip 220 and tin plating 236 which is formed on a substrate 210. A protrusion of the bump 232 having a convex shape is attached to the tin plating 236.

Figure 9J:
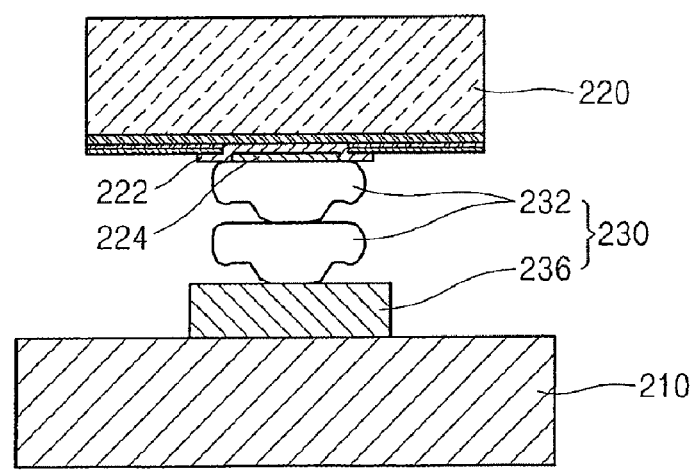

A bump structure 230 of FIG. 9J includes stack type bumps 230 which are formed on a pad 222 of a chip 220 and tin plating 236 which is formed on a substrate 210. The stack type bumps 232 have convex shapes and protrusions which are attached to each other to face the same direction, and the protrusion of the upper bump 232 is attached to the tin plating 236. A UBM 224 may be formed underneath the pad 222 of the chip 220.

Bump structures having various structures have been described. However, the bump structures are not limited thereto and may be formed in various forms. For example, a UBM may be selectively formed on a pad of a chip, and a structure of a bump or a combination between bumps may be modified into various forms. Also, a bump or pattern formed of aluminum or tin on a substrate may be formed of different thermal conductive materials, and a structure of the bump or pattern may be modified into various forms.

In the power module of the present embodiment, chips can be mounted on a substrate or a lead frame using a flip-chip bonding method to desirably reduce the overall size of the power module compared to the case when wire bonding is used. A mother board on which the power module is mounted or an application board such as a system PCB can be further made compact due to the reduction of the entire size of the power module. Coefficients of thermal expansion (CTE) mismatch may be minimized through the reduction of the entire size of the power module and the selection of a substrate formed of an appropriate material, particularly, an interconnecting substrate. Also, chips can be mounted on the lead frame or the interconnecting substrate using the bump structure without using bonding of long wires. Thus, an operation characteristic of the power module can be improved.

Figure 10:
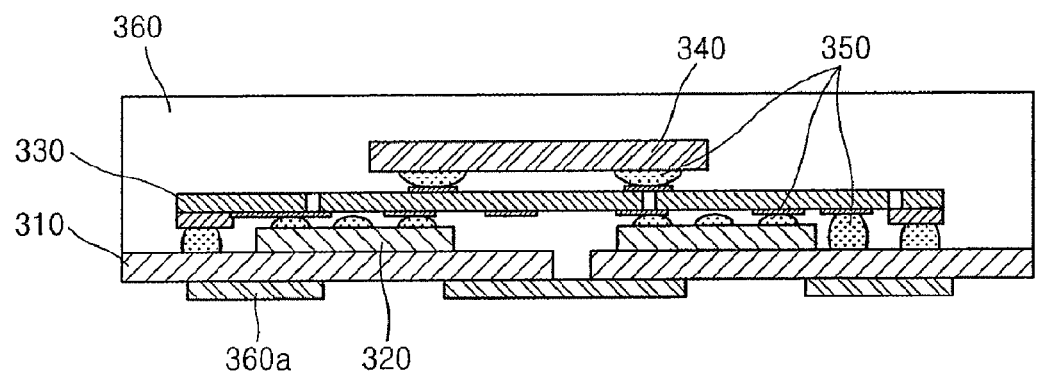
FIG. 10 is a cross-sectional view illustrating a power module having a stacked flip-chip according to another embodiment of the present invention.

FIG. 10 is a cross-sectional view of a power module with a stacked flip-chip according to another embodiment of the present invention. Referring to FIG. 10, the power module includes a power device part, a control device part, a lead frame 310, and an interconnecting substrate 330. The power device part includes a power device chip 320. The control device part includes a control device chip 340. Chips of the power device part are stacked on the lead frame 310, and the lead frame 310 supports the power module. The chip 320 of the power device part is attached to a lower surface of the lead frame 310 using a flip-chip bonding method, the chip 340 is attached to an upper surface of the interconnecting substrate 330 using a flip-chip bonding method, and the interconnecting substrate 330 supports the power module together with the lead frame 310.

The lead frame 310 is formed of a material operating as a thermal substrate, i.e., emitting heat generated from the power device part. Chips of the power and control device parts are attached to the interconnecting substrate 330 through solder 350 using a flip-chip bonding method. The chips of the power and control device parts, a portion of the lead frame 310, and the interconnecting substrate 330 are sealed by a sealant such as an EMC. The sealant 360 includes convex portions 360a through which a mounting strength of the power module on a system board or the like can be improved.

The chips of the power device part may be metal-oxide semiconductor field effect transistors (MOSFETs), diodes, or the like, and the chips of the control device part may be control device ICs or the like. Also, a plurality of R.L.C devices may be disposed on each of the power and control device parts to drive devices.

In the power module of the present embodiment, power device chips or control device chips can be stacked using a flip-chip bonding method so as to desirably reduce an entire size of the power module. The power module of the present embodiment has a surface mount device (SMD) package structure. However, the power module of the present embodiment is not limited to the SMD package structure. Elements of the power module of the present embodiment will now be described in detail with reference to the attached drawings.

Figure 11A:
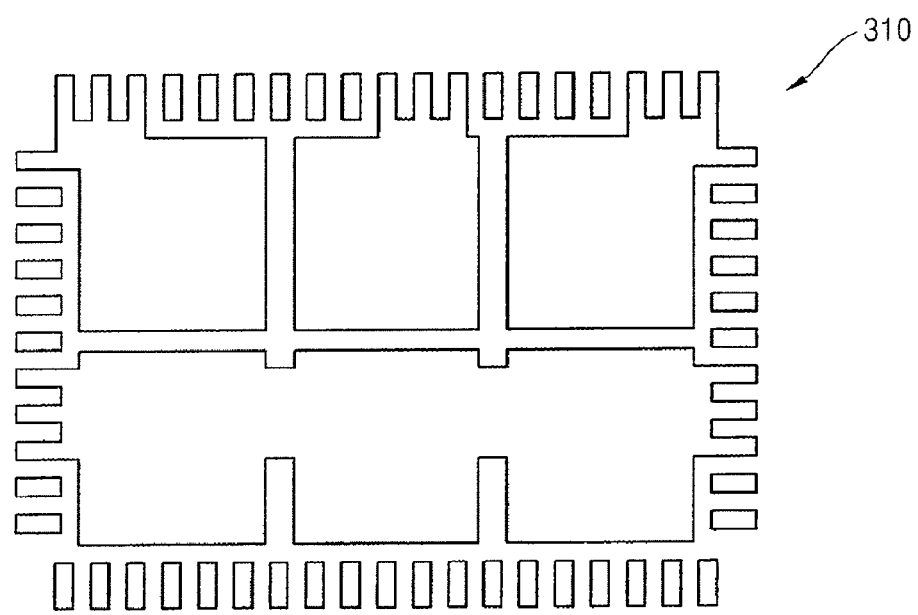
FIGS. 11A and 11B are a plan view and a side view illustrating in more detail a lead frame of FIG. 10.
Figure 11B:
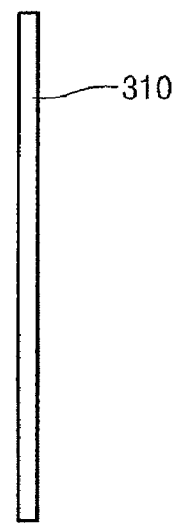

FIGS. 11A and 11B are a plan view and a side view illustrating in more detail the lead frame 310 of FIG. 10.

FIG. 11A is a plan view illustrating an upper surface of the lead frame 310 of the power module of the present embodiment. Referring to FIG. 11A, the lead frame 310 has a rectangular shape and predetermined patterns formed at an edge thereof. The predetermined patterns are formed to increase an adhesive strength in a molding process and form a convex structure of the power module. The lead frame 310 may be formed of copper (Cu) but is not limited thereto.

FIG. 11B is a side view of the lead frame 310 of FIG. 11A. Referring to FIG. 11B, the lead frame may be formed to a thickness between 0.38 mm and 0.40 mm. Differently from the previous embodiments, the lead frame 310 may be horizontally formed without a bending depth.

The lead frame 310 of the present embodiment has a unit size of about $18.6 \times 13.0$ mm$^2$ and the thickness between 0.38 mm and 0.40 mm as described above. Also, 60 unit size lead frames may be attached to one another to form a strip size of about $248.3 \times 63.4$ mm$^2$. Since chips are connected to the lead frame 310 without wire bonding, the size of the lead frame 310 can be considerably reduced.

Figure 11C:
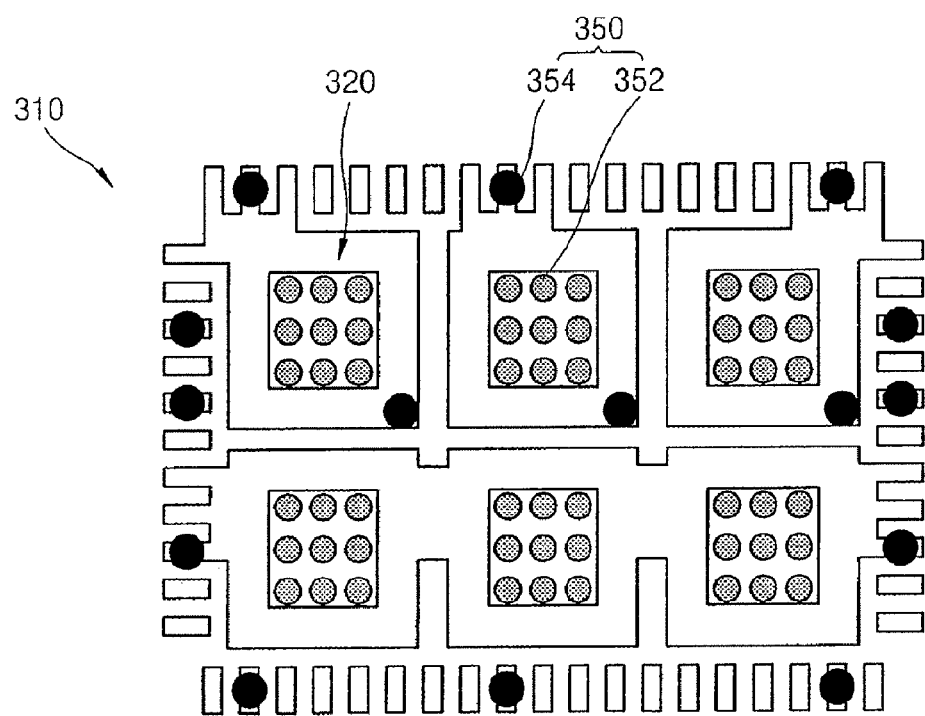
FIGS. 11C and 11D are a plan view and a cross-sectional view illustrating power device chips stacked on the lead frame of FIG. 11A.
Figure 11D:
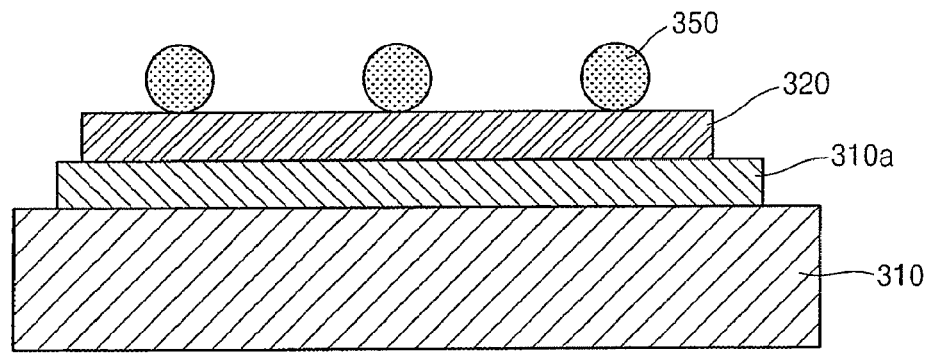

FIGS. 11C and 11D are a plan view and a side view illustrating power device chips stacked on the lead frame 310 of FIG. 11A.

Referring to FIG. 11C, power device chips 320 on which chip combining solder 352 are formed, e.g., every 6 MOSFETs, are stacked on the lead frame 310. The MOSFETs 320 are attached to an interconnecting substrate 330 through the chip combining solder 352 using a flip-chip bonding method. Inter-substrate solder 354 are formed at edges of the lead frame 310 and directly and electrically connect the lead frame 310 to the interconnecting substrate 330.

FIG. 11D is a side view illustrating only one MOSFET 320. The MOSFET 320 on which solder is formed is stacked on the lead frame 310. The MOSFET 320 is stacked on the lead frame 310 through a solder adhesive 310a, e.g., solder wires or solder paste. The lead frame 310 may be formed to a thickness of about 0.38 mm as described above in some embodiments. A thickness of the MOSFET 320 may be 0.1 mm, and a thickness of the solder adhesive 310a may be about 0.1 mm in some embodiments.

Figure 12A:
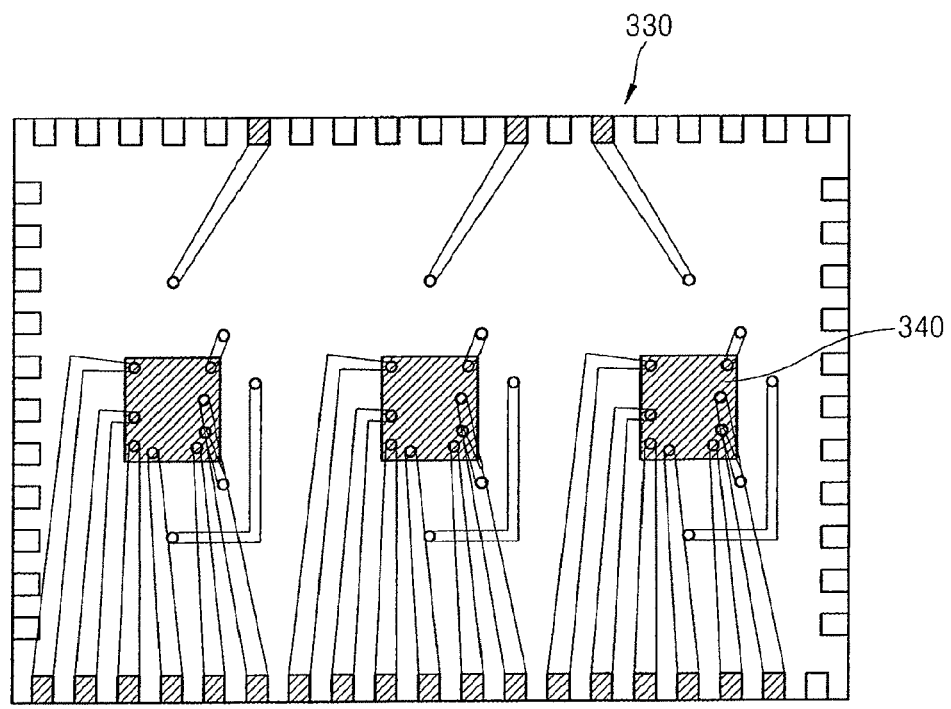
FIGS. 12A and 12B are a plan view and a cross-sectional view illustrating control device chips mounted on a interconnecting substrate of FIG. 10.
Figure 12B:
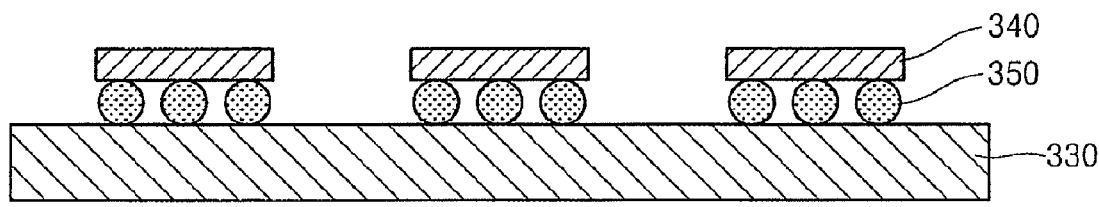

FIGS. 12A and 12B are a plan view and a side view illustrating control device chips mounted on the interconnecting substrate 330 of FIG. 10.

FIG. 12A is a plan view illustrating control device chips 340 mounted on an upper surface of the interconnecting substrate 330. Vias and wires are formed in the interconnecting substrate 330 so as to combine the control device chips 340 with the upper surface of the interconnecting substrate 330 and power device chips with a lower surface of the interconnecting substrate 330.

The interconnecting substrate 330 may be formed of various materials such as a TFC, a PCB, a FPCB, an IMS, a pre-molded substrate, a DBC, ceramic, or the like in various structures as in the previous embodiment. The interconnecting substrate 330 may have a unit size of about $17.0 \times 11.50$ mm$^2$ and a thickness between 0.80 mm and 1.0 mm but is not limited thereto.

FIG. 12B is a side view of the control device chips 340. Referring to FIG. 12B, the control device chips 340 are mounted on the interconnecting substrate 330 through solder 350 using a flip-chip bonding method.

Figure 13A:
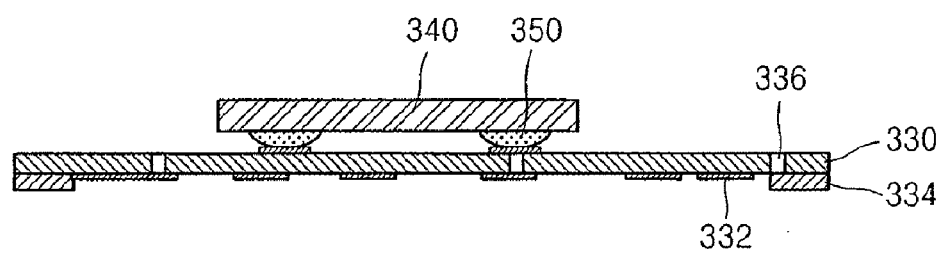
FIG. 13A is a cross-sectional view illustrating in more detail the interconnecting substrate and the control device chips of FIG. 10.

FIG. 13A is a cross-sectional view illustrating the interconnecting substrate 330 and the control device chips 340 of FIG. 10 in more detail. Referring to FIG. 13A, bumps 332 and 334 are formed on lower and upper surfaces of the interconnecting substrate 330. The bumps 332 are to combine the interconnecting substrate 330 with chips, and the bumps 334 are used for inter-substrate solder combining. The bumps 334 are formed at an edge of the interconnecting substrate 330 to correspond to portions of the lead frame 310 at which the inter-substrate solder 354 are formed. Vias 336 are formed in the interconnecting substrate 330 to electrically connect upper and lower portions of the interconnecting substrate 330. The control device chips 340 are stacked on the interconnecting substrate 330 through the solder 350 using a flip-chip bonding method.

Figure 13B:
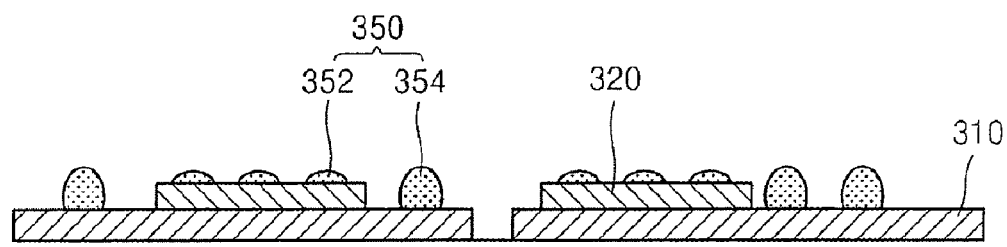
FIG. 13B is a cross-sectional view illustrating the lead frame and the power device chips underneath the interconnecting substrate of FIG. 10.

FIG. 13B is a cross-sectional view illustrating in more detail the lead frame 310 and the power device chips 320 under the interconnecting substrate 330 of FIG. 10. Referring to FIG. 13B, the power device chips 320, e.g., the MOSFETs on which the solder 350 are formed, are adhered to and stacked on the lead frame 310, e.g., on the upper surface of the lead frame 310 through a solder adhesive. The inter-substrate solder 354 are formed at the edge of the lead frame 310 to electrically connect the lead frame 310 to the interconnecting substrate 330.

An interconnecting substrate portion of FIG. 13a and a lead frame portion of FIG. 13B are separately formed and attached to each other in a multi-jig so as to complete the power module. The interconnecting substrate portion and the lead frame portion may be attached to each other and then molded and trimmed.

Figure 14:
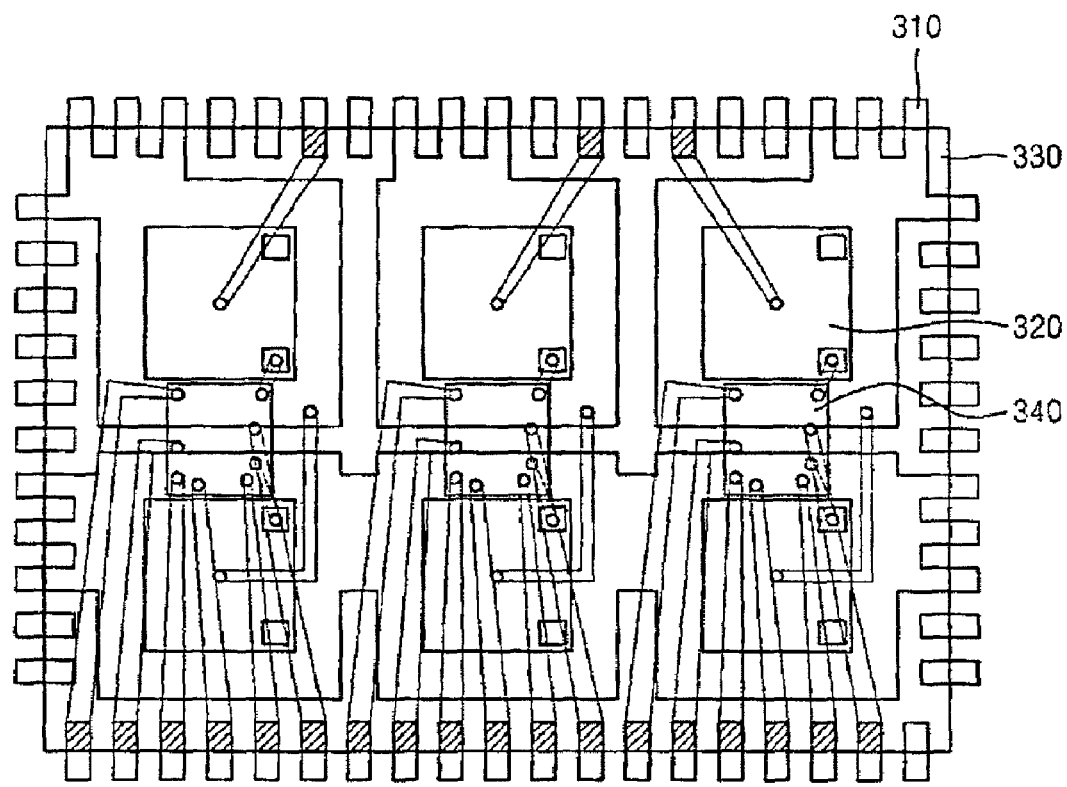
FIG. 14 is a plan view illustrating in more detail the power module of FIG. 10.

FIG. 14 is a plan view illustrating the power module of FIG. 10 in more detail. Referring to FIG. 14, the lead frame 310 of FIG. 11C, upon which the power device chips 320 are stacked, is attached to the interconnecting substrate 330 upon which the control device chips 340 are stacked.

As described above, the size of the power module of the present embodiment can desirably reduced compared to the conventional power module. For example, the size of the power module of the present embodiment can be reduced by about 45% compared to a conventional SPM5 having a size of $29.0 \times 12.0 \times 3.15$ mm$^3$. In other words, the power module of the present embodiment can be fabricated to have a size of about $16.5 \times 11.7 \times 2.0$ mm$^3$.

As in the previous embodiment, in the present embodiment, chips can be mounted on a substrate using a flip-chip bonding method so as to reduce a size of the power module. Thus, an application board such as a system PCB or the like can be made compact. Also, the operation characteristic of the power module can be improved through the improvement of thermal conductivity mismatch.

Figure 15:
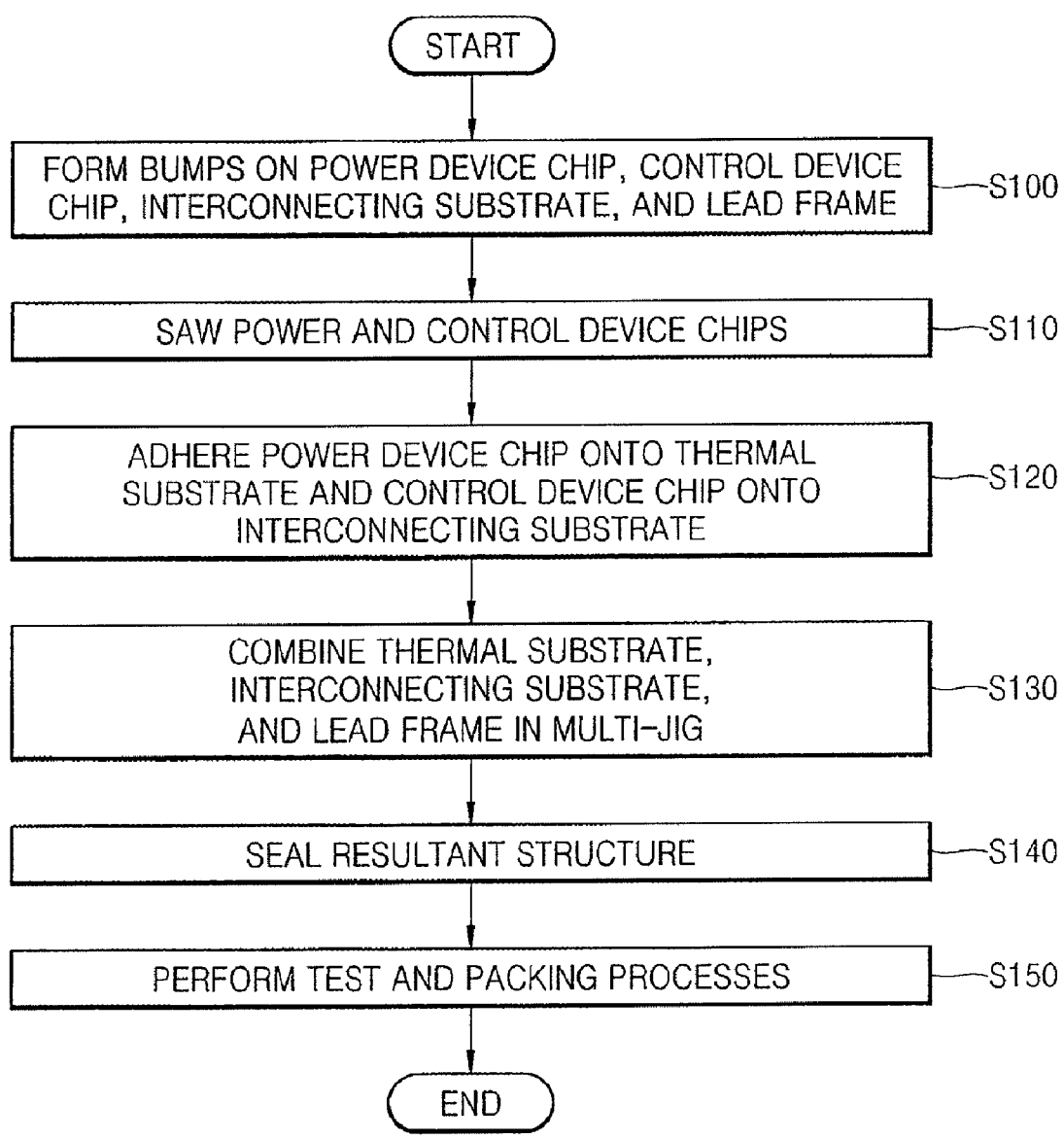
FIG. 15 is a flowchart of a method of fabricating the power module of FIG. 3 according to an embodiment of the present invention.

FIG. 15 is a flowchart of a method of fabricating the power module of FIG. 3 according to an embodiment of the present invention. The method will now be described with reference to FIGS. 3 and 15.

Referring to FIGS. 3 and 15, in operation 100, bumps are formed on the power device chip 120, the control device chip 150, the interconnecting substrate 140, and the lead frame 170. The bumps are formed on the power device chip 120 and the control device chip 150 on a wafer level. If convex shape bumps are required on the interconnecting substrate 140 and the lead frame 170, the convex shape bumps may be selectively formed. Processes of forming the bumps may be separately performed.

In step operation S110, the power device chip 120 and the control device chip 150 on which the bumps are formed on the wafer level are sawed into individual chips. In operation S120, the power device chip 120 is adhered onto the thermal substrate 110, and the control device chip 150 is adhered onto the interconnecting substrate 140 using a flip-chip bonding method. The adhesion of the power device chip 120 onto the thermal substrate 110 may be performed using a solder screen print method. The adhesion of the control device chip 150 onto the interconnecting substrate 140 may be performed using solder balls, solder paste dotting or dispense, thermal press, or the like.

In operation S130, the thermal substrate 110, the lead frame 170, and the interconnecting substrate 140 are attached to one another in a multi-jig structure. The combination among the thermal substrate 110, the lead frame 170, and the interconnecting substrate 140 may be performed using solder paste dotting or solder screen print.

After the thermal substrate 110, the lead frame 170, and the interconnecting substrate 140 are attached to one another, a simultaneous reflow process and a flux cleaning process may be performed with respect to the resultant structure. In operation S140, the resultant structure is sealed by a sealant such as an EMC.

In operation S150, test and packing processes are performed to complete the power module. Plating and trimming processes may be performed before the test and packing processes.

A power module as in the previous embodiment can be easily fabricated using the fabricating processes of the present embodiment, and chips can be mounted on a substrate or the like using a flip-chip bonding method. Thus, the power module can be made very compact. As a result, the power module can have a good operation characteristic, e.g., a DIP structure.

Figure 16:
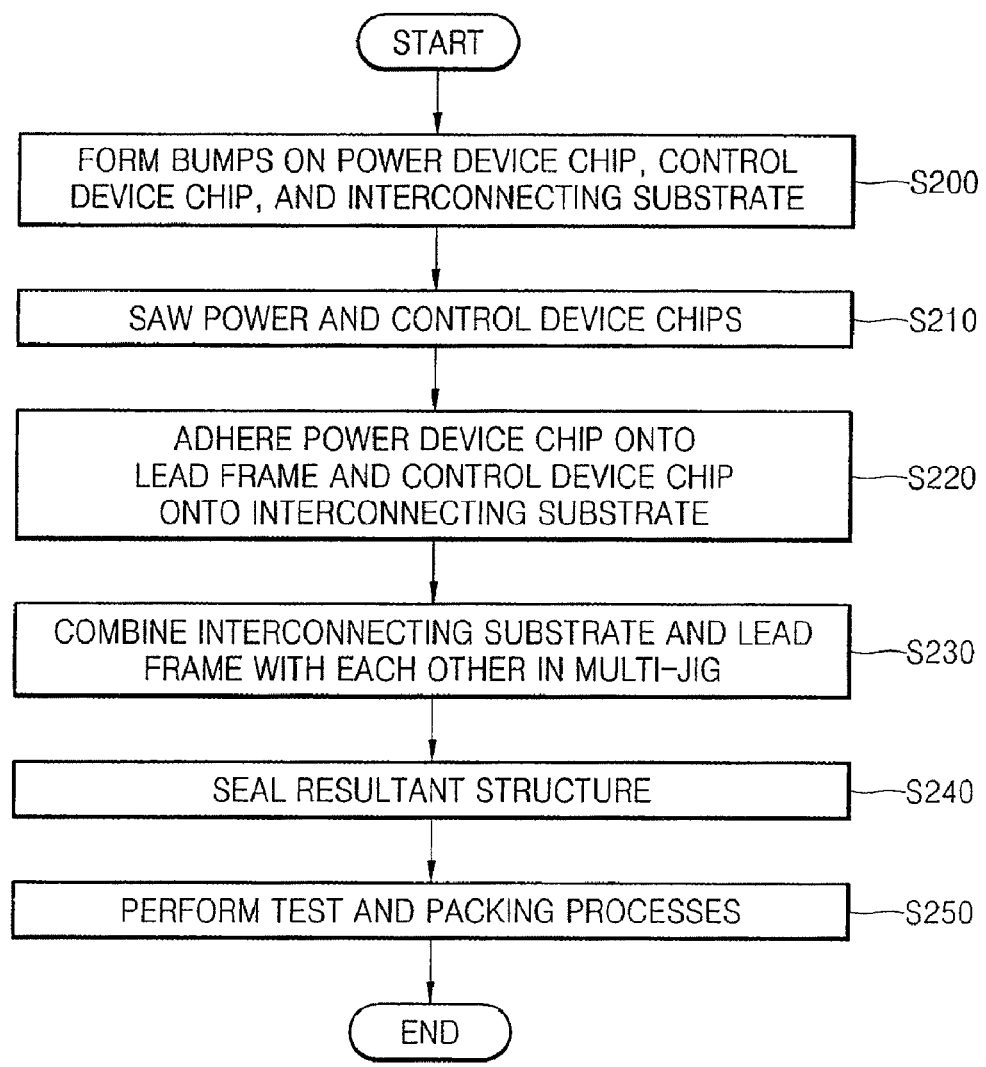
FIG. 16 is a flowchart of a method of fabricating the power module of FIG. 9 according to another embodiment of the present invention.

FIG. 16 is a flowchart of a method of fabricating the power module of FIG. 10 according to another embodiment of the present invention. The method will now be described with reference to FIGS. 10 and 16.

In operation S200, bumps are formed on the power deice chip 320, the control device chip 340, and the interconnecting substrate 330. The bumps are formed on the power device chip 320 and the control device chip 340 on a wafer level. If convex type bumps are required on the interconnecting substrate 330, the convex type bumps may be selectively formed. In the case of the lead frame 310, convex type bumps may be selectively formed if necessary. Processes of forming the bumps may be separately performed.

In operation S210, the power device chip 320 and the control device chip 340 are separately sawed into individual chips. In operation S220, the power device chip 320 is adhered onto the lead frame 310, and the control device chip 340 is adhered onto the interconnecting substrate 330 using a flip-chip bonding method. The adhesion of the power device chip 320 onto the lead frame 310 may be performed using solder screen print, and the adhesion of the control device chip 340 onto the interconnecting substrate 330 may be performed using solder balls, solder paste dotting, thermal press, or the like. Here, the lead frame 310 may operate as a thermal substrate.

In operation S230, the lead frame 310 and the interconnecting substrate 330 are attached to each other in a multi-jig. The combination between the lead frame 310 and the interconnecting substrate 330 may be performed using solder paste dotting or solder screen print.

After the lead frame 310 and the interconnecting substrate 330 are attached to each other, a simultaneous reflow and a flux cleaning process may be performed with respect to the resultant structure. In operation S240, the resultant structure is sealed by a sealant such as an EMC or the like.

In operation S250, test and packing processes are formed to complete the power module. Plating and trimming processes may be performed with respect to an external lead frame before the test and packing processes are performed.

The power module of the present embodiment can be easily fabricated through the fabricating processes of the present embodiment as described above, and chips can be mounted on a substrate using a flip-chip bonding method. Thus, the power module can be made compact. As a result, the power module can have a good operation characteristic, e.g., a SMD structure.

As described above, in a power module having a stacked flip-chip and a method of fabricating the power module according to the present in invention, chips can be mounted on an interconnecting substrate or a lead frame using a flip-chip bonding method. Thus, the overall size of the power module can desirably reduced compared to the case when wire bonding is used.

Also, an application board such as a mother board or a system PCB on which the power module is mounted can be further made compact due to the reduction of the entire size of the power module.

In addition, a thermal conductivity mismatch can be minimized through the reduction of the entire size of the power module and a selection of a substrate or an interconnecting substrate formed of an appropriate material. Moreover, the chips can be mounted on the lead frame or the interconnecting substrate using a bump structure without using bonding of long wires. Thus, an operation characteristic of the power module can be improved.

The power module can be easily fabricated using the method. Also, the power module can have a very small size and a good operational characteristic. For example, the power module can have a DIP or SMD structure.

While the present invention has been particularly shown and described with reference to exemplary embodiments thereof, it will be understood by those of ordinary skill in the art that various changes in form and details may be made therein without departing from the spirit and scope of the present invention as defined by the following claims.

One or more features from any embodiment may be combined with one or more features of any other embodiment without departing from the scope of the invention.

A recitation of "a", "an" or "the" is intended to mean "one or more" unless specifically indicated to the contrary.

What is claimed is:

1. A power module having a stacked flip-chip, comprising: a lead frame; a control device part comprising a control device chip; a power device part comprising a power device chip and being electrically connected to the lead frame; and an interconnecting substrate on which the control and power device parts are respectively disposed at upper and lower portions, a thermal substrate coupled to the power device chin, wherein the thermal substrate emits heat generated from the power device part, wherein each of the control and power device chips is attached to one of the lead frame and the interconnecting substrate using a plurality of flip-chip electrical bonds, wherein the lead frame comprises first and second lead frame portions, wherein the first lead frame portion has a first portion that extends underneath the interconnecting substrate, and the second lead frame portion has a second portion that extends on an upper surface of the interconnecting substrate, wherein the first portion is longer than the second portion, wherein the power device part is disposed between the first lead frame portion and the thermal substrate, and wherein the power device chip of the power device part is attached to a lower surface of the first lead frame portion using at least one electrical bond.

2. The power module of claim 1, wherein a copper (Cu) film is stacked on a ceramic substrate to form the thermal substrate.

3. The power module of claim 1, wherein: the first lead frame portion is formed underneath the interconnecting substrate in a W shape to be attached to the interconnecting substrate; a metal wire layer is formed on an upper surface of the power device chip of the power device part; and the power device chip of the power device part is attached to a W-shaped lower portion of the first lead frame portion through a solder adhesive of solder wire or solder paste type to be connected to the metal wire layer.

4. The power module of claim 3, wherein the metal wire layer is formed of one of Al/Ni, Al/Ni/Ag, Al/ENIG (Electroless Nickel-Immersion Gold)-bumps and Al/TiCuNiAu-bumps.

5. The power module of claim 1, wherein the power device chip of the power device part is adhered onto the thermal substrate through a solder adhesive of solder wire or solder paste type.

6. The power module of claim 1, wherein the control device chip of the control device part is attached to an upper surface of the interconnecting substrate.

7. The power module of claim 1, wherein upper and lower boards are attached to each other to form the interconnecting substrate, and predetermined patterns are formed on the lower board of the interconnecting substrate so as to dispose the first lead frame portion among the predetermined patterns.

8. The power module of claim 1, wherein the first lead frame portion is divided into lower and upper portions to have a predetermined bending depth, and the lower portion of the first lead frame portion extends underneath the interconnecting substrate.

9. The power module of claim 8, wherein a convex type bump is formed on the lower portion of the first lead frame portion to combine the first lead frame portion with the power device chip.

10. The power module of claim 1, wherein the power and control device chips are attached to one of the interconnecting substrate and the first lead frame portion using one of a bump structure, a solder structure, and a bump and solder structure.

11. The power module of claim 10, wherein the power and control device chips are attached to one of the interconnecting substrate and the first lead frame portion using one of the bump and solder structure and the solder structure, and one of the bump and solder structure and the solder structure comprises a structure which comprises one of:
a bump which is formed on a pad of the chips and solder which encloses the bump and is formed between the chip and one of the interconnecting substrate and the first lead frame portion;
a first bump which is formed on the pad of the chip, a second bump which is formed on one of the interconnecting substrate and the first lead frame portion, and solder which encloses the first and second bumps and is formed between the chip and one of the interconnecting substrate and the first lead frame portion;
a stack type bump which is formed on the pad of the chip and solder which encloses the stack type bump and is formed between the chip and one of the interconnecting substrate and the first lead frame portion;
a stack type bump which is formed on one of the interconnecting substrate and the first lead frame portion and solder which encloses the stack type bump and is formed between the chip and one of the interconnecting substrate and the first lead frame portion;
solder which is formed between the pad of the chip and one of the interconnecting substrate and the first lead frame portion; and
a bump which is formed on one of the interconnecting substrate and the first lead frame portion and solder which encloses the bump and is formed on the chip and one of the interconnecting substrate and the first lead frame portion.

12. The power module of claim 11, wherein an under bump metal (UBM) is formed on the pad on one of the power device chip and the control chip.

13. The power module of claim 10, wherein the power and control device chips are attached to one of the interconnecting substrate and the first lead frame portion using a bump structure, and the bump structure comprises a structure which comprises one of:
a first bump which is formed on a pad of the chip and a second bump which is connected to the first bump and formed on one of the interconnecting substrate and the first lead frame portion;
a first bump which is formed on the pad of the chip, one of plate-shaped aluminum (Al) bump and pattern which is formed on one of the interconnecting substrate and the first lead frame portion, and a second bump which is formed between the first bump and one of the plate-shaped Al bump and pattern;
a first bump which is formed on the pad of the chip and a tin (Sn) plated plate which is connected to the first bump and formed on one of the interconnecting substrate and the first lead frame portion; and
a first bump which is formed on the pad of the chip, a second bump which is formed on the first bump, and a Sn plated plate which is connected to the second bump and formed on one of the interconnecting substrate and the first lead frame portion.

14. A power module having a stacked flip-chip, comprising: a control device part comprising a control device chip; a power device part comprising a power device chip; a thermal substrate on which the power device part is attached and which emits heat generated from the power device part; a lead frame which is disposed on the thermal substrate and attached to the power device chip of the power device part using a plurality of flip-chip electrical bonds; and an interconnecting substrate which is attached to the lead frame and on which the control device chip of the control device part is stacked and attached using a plurality of flip-chip electrical bonds, and wherein the lead frame comprises first and second lead frame portions, wherein the first lead frame portion has a first portion that extends underneath the interconnecting substrate, and the second lead frame portion has a second portion that extends on an upper surface of the interconnecting substrate, wherein the first portion is longer than the second portion, and wherein the rower device chip of the rower device part is attached to a lower surface of the first lead frame portion using at least one electrical bond.

15. The power module of claim 14, wherein upper and lower boards are attached to each other to form the interconnecting substrate, and predetermined patterns are formed on the lower board of the interconnecting substrate so as to dispose the first lead frame portion among the predetermined patterns.

16. The power module of claim 15, wherein the first lead frame portion is divided into lower and upper portions to have a predetermined bending depth, and the lower portion extends underneath the interconnecting substrate.

17. The power module of claim 14, wherein the first lead frame portion is divided into lower and upper portions to have a predetermined bending depth, and the lower portion of the first lead frame portion extends underneath the interconnecting substrate, forms a W-shaped lower portion underneath the interconnecting substrate, and is attached to the interconnecting substrate.

18. The power module of claim 17, wherein a metal wire layer is formed on an upper surface of the power device chip of the power device part, and the power device chip of the power device part is attached to the W-shaped lower portion of the first lead frame portion through a solder adhesive of solder wire or solder paste type to be connected to the metal wire layer.

19. The power module of claim 14, wherein the control device part comprises one of a boost diode (B.S diode) and a thermistor, and the power device part comprises a diode chip.

20. The power module of claim 14, wherein the control device chip comprises low and high voltage integrated circuits (LV and HV ICs), and the power device chip comprises an IGBT (insulated gate bipolar transistor) chip.

21. The power module of claim 14, wherein the power module has a DIP (dual in-line package) structure.

* * * * *